US007348712B2

(12) United States Patent
Ogawa et al.

(10) Patent No.: US 7,348,712 B2
(45) Date of Patent: Mar. 25, 2008

(54) ULTRASONIC PROBE AND ULTRASONIC DIAGNOSTIC APPARATUS

(75) Inventors: Takashi Ogawa, Nasushiobara (JP); Takashi Takeuchi, Otawara (JP); Koichi Shibamoto, Otawara (JP); Hisashi Nakamura, Otawara (JP); Hiroyuki Shikata, Nasushiobara (JP); Taihei Sato, Nasushiobara (JP)

(73) Assignees: Kabushiki Kaisha Toshiba, Tokyo (JP); Toshiba Medical Systems Corporation, Otawara-shi (JP)

( * ) Notice: Subject to any disclaimer, the term of this patent is extended or adjusted under 35 U.S.C. 154(b) by 366 days.

(21) Appl. No.: 11/103,616

(22) Filed: Apr. 12, 2005

(65) Prior Publication Data

US 2005/0261590 A1 Nov. 24, 2005

(30) Foreign Application Priority Data

Apr. 16, 2004 (JP) ............................ 2004-122060
Apr. 16, 2004 (JP) ............................ 2004-122061

(51) Int. Cl.
*H01L 41/08* (2006.01)

(52) U.S. Cl. ...................................... 310/334; 310/367

(58) Field of Classification Search ......... 310/334–337
See application file for complete search history.

(56) References Cited

U.S. PATENT DOCUMENTS 3,964,014 A * 6/1976 Tehon ........................ 367/155
4,425,525 A * 1/1984 Smith et al. ................ 310/336
4,869,768 A * 9/1989 Zola ........................... 156/245
5,099,459 A * 3/1992 Smith ......................... 367/153
5,115,810 A * 5/1992 Watanabe et al. ........... 600/459
5,392,259 A * 2/1995 Bolorforosh ................ 367/152
5,438,554 A * 8/1995 Seyed-Bolorforosh et al. .......................... 367/140
5,457,863 A * 10/1995 Thomas et al. ............ 29/25.35

FOREIGN PATENT DOCUMENTS

JP 5-38335 2/1993
JP 11-146492 5/1999
JP 2003-9288 1/2003

* cited by examiner

*Primary Examiner*—Mark Budd
(74) *Attorney, Agent, or Firm*—Oblon, Spivak, McClelland, Maier & Neustadt, P.C.

(57) ABSTRACT

An ultrasonic probe includes ultrasonic piezoelectric elements that are arranged in a first direction at predetermined intervals and transmit and receive ultrasonic waves in a second direction substantially orthogonal to the first direction. The respective ultrasonic piezoelectric elements have plural grooves, which are parallel to the first direction and do not pierce through an end face, on at least one end face of two end faces substantially orthogonal to the second direction of the respective ultrasonic piezoelectric elements. The ultrasonic waves are weighted in a third direction orthogonal to the first direction and the second direction according to shapes and arrangement of the respective plural grooves and transmitted and received. In addition, a conductive member is joined to the end face having the grooves of the respective ultrasonic piezoelectric elements along the third direction.

18 Claims, 15 Drawing Sheets

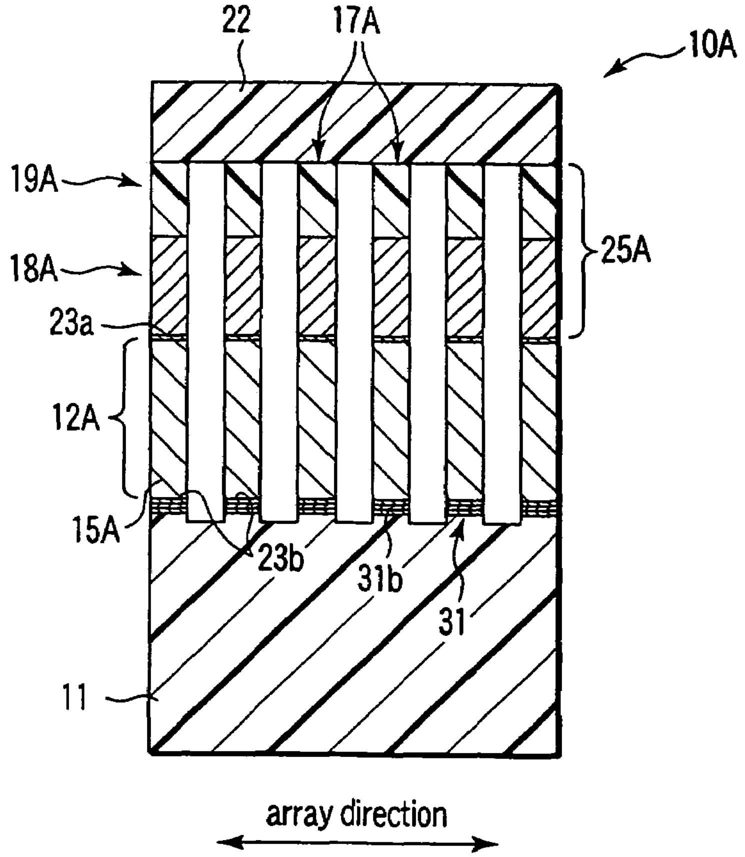
F I G. 3
*FIG. 4*
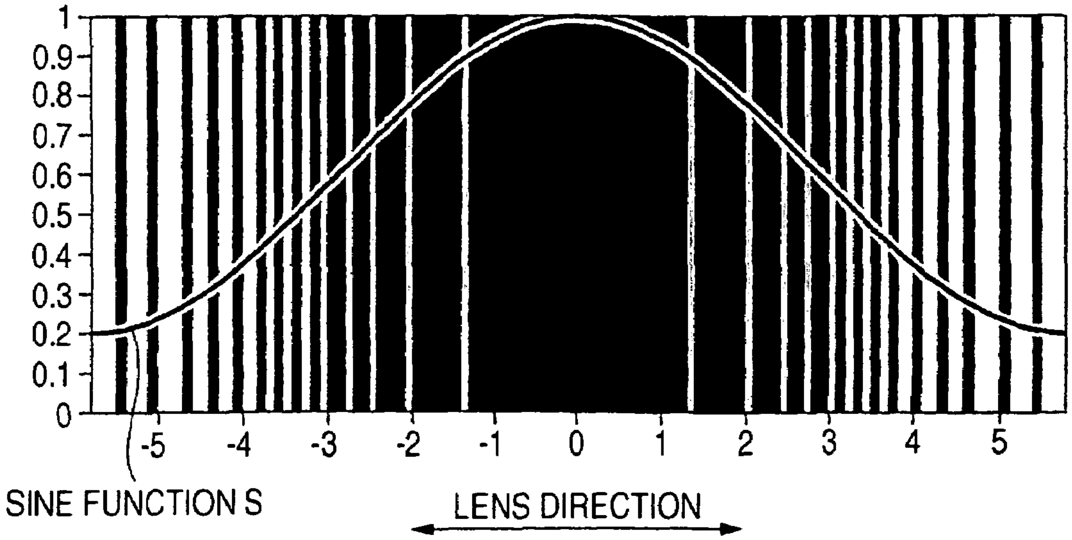

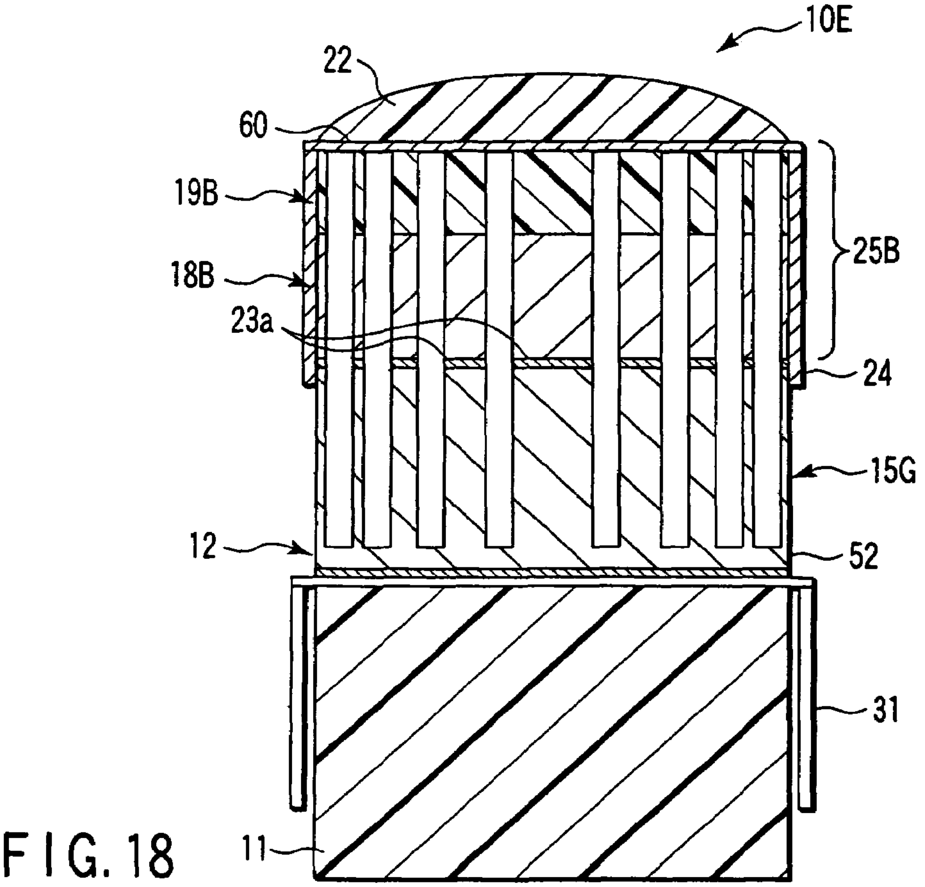
FIG. 18
FIG. 19
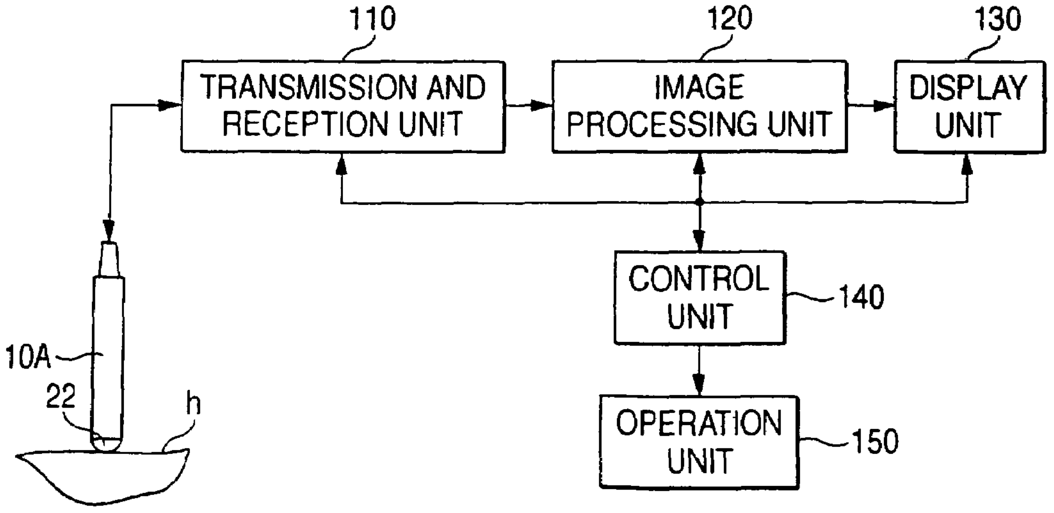

ULTRASONIC PROBE AND ULTRASONIC DIAGNOSTIC APPARATUS

CROSS-REFERENCE TO RELATED APPLICATIONS

This application is based upon and claims the benefit of priority from prior Japanese Patent Applications No. 2004-122060, filed Apr. 16, 2004; and No. 2004-122061, filed Apr. 16, 2004, the entire contents of both of which are incorporated herein by reference.

BACKGROUND OF THE INVENTION

1. Field of the Invention

The present invention relates to an ultrasonic probe and an ultrasonic diagnostic apparatus with side lobes reduced by weighting a transmission intensity and a reception intensity of ultrasonic waves to be transmitted and received.

2. Description of the Related Art

An ultrasonic probe is a device for, with an object of visualization or the like of the inside of an object, irradiating ultrasonic waves to the object and receiving reflected waves from interfaces having different acoustic impedances in the object. As ultrasonic image apparatuses in which such an ultrasonic probe is adopted, there are a medical diagnostic apparatus and the like for inspecting the inside of a human body.

As the ultrasonic probe, there is one called a linear array ultrasonic probe. This linear array ultrasonic probe has a piezoelectric element unit carrying out transmission and reception of ultrasonic waves. The piezoelectric element unit includes plural piezoelectric elements that are arranged in parallel at fixed intervals in an array direction. On a human body side of the piezoelectric unit, an acoustic matching layer and an acoustic lens are stacked sequentially to cover all the piezoelectric elements. On a side opposite to the human body side of the piezoelectric unit, a back member is provided.

When the linear array ultrasonic probe is used, a drive circuit applies drive signals to the respective piezoelectric elements. At the same time, phases of the drive signals applied to the respective piezoelectric elements are shifted by a delay circuit, whereby irradiation positions of the ultrasonic waves are moved in the array direction to scan a patient.

The ultrasonic waves generated from the respective piezoelectric elements are transmitted to the human body via the acoustic matching layer and the acoustic lens. Then, the piezoelectric element unit receives reflected waves generated by mismatching of acoustic impedances in the human body, whereby an internal structure of the human body is visualized and shown on a display monitor.

When the piezoelectric element unit is manufactured, first, the acoustic matching layer is joined to a rectangular piezoelectric material block. Next, the back member is joined thereto and only the piezoelectric material block is subjected to dicing at predetermined intervals to change the piezoelectric material block into arrays, that is, divide the piezoelectric material block into plural piezoelectric elements.

Next, the acoustic lens is joined to the acoustic matching layer. Finally, the drive circuit and the respective piezoelectric elements are electrically connected, whereby the ultrasonic probe is completed.

Incidentally, in the linear array ultrasonic probe, when a drive signal of a rectangular waveform is applied to the respective piezoelectric elements, side lobes in sound fields in a lens direction cause problem or the sound fields in the lens direction are made non-uniform.

Therefore, in recent years, a technique for weighting intensities of ultrasonic waves transmitted from a piezoelectric element unit to reduce side lobes or to make sound fields uniform has been disclosed.

For example, an ultrasonic probe having respective piezoelectric elements divided in a lens direction at varied intervals to weight an area density of the piezoelectric elements with respect to the lens direction is disclosed (see, for example, JP-A-2003-9288).

In addition, an ultrasonic probe having respective piezoelectric elements divided at fixed intervals in a lens direction to weight drive signals applied to the divided respective piezoelectric elements is also disclosed (see, for example, JP-A-5-38335).

Moreover, an ultrasonic probe having an acoustic matching layer divided at varied intervals in a lens direction to weight an area density of the acoustic matching layer in the lens direction is also disclosed (see, for example, JP-A-11-146492).

However, the ultrasonic probes disclosed in JP-A-2003-9288, JP-A-5-28331, and JP-A-11-146492 have problems described below.

(JP-A-2003-9288)

When the piezoelectric element unit is manufactured, the respective piezoelectric elements are completely divided in the lens direction. Thus, contrivance for positioning pieces of the respective piezoelectric elements with respect to one another is required, which causes an increase of manufacturing steps and an increase in manufacturing cost.

In addition, when resin or the like is filled among the pieces of the respective piezoelectric elements, electrodes formed on end faces of the respective piezoelectric elements overlap the resin partially, adhesion of the electrodes to the piezoelectric elements falls to deteriorate reliability in the apparatus.

Moreover, even if grooves for weighting are formed in the respective piezoelectric elements, ultrasonic waves emitted from the piezoelectric elements cause acoustic crosstalk in the acoustic matching layer. Thus, it is difficult to obtain a desired sound pressure distribution.

(JP-A-5-38335)

Structures of the apparatus and the circuit are complicated to cause deterioration in reliability in the ultrasonic probe and an increase in cost for a manufacturing process.

(JP-A-11-146492)

Even if grooves for weighting are formed in the respective acoustic matching layer, ultrasonic waves emitted from the piezoelectric elements have already caused acoustic crosstalk in the piezoelectric elements. Thus, it is difficult to obtain a desired sound pressure distribution.

BRIEF SUMMARY OF THE INVENTION

The invention has been devised in view of the circumstances and it is a first object of the invention to provide an ultrasonic probe and an ultrasonic diagnostic apparatus that can reduce side lobes and has high reliability without complicating an apparatus structure and a manufacturing process. It is a second object of the invention to provide an ultrasonic probe and an ultrasonic diagnostic apparatus that can uniformalize sound fields and has high reliability.

In order to solve the problems and attain the objects, an ultrasonic probe and an ultrasonic diagnostic apparatus of the invention are constituted as described below.

(1) An ultrasonic probe includes ultrasonic piezoelectric elements that are arranged in a first direction at predetermined intervals and transmit and receive ultrasonic waves in a second direction substantially orthogonal to the first direction. The respective ultrasonic piezoelectric elements have plural grooves, which are parallel to the first direction and do not pierce through an end face, on at least one end face of two end faces substantially orthogonal to the second direction of the respective ultrasonic piezoelectric elements. The ultrasonic waves are weighted in a third direction orthogonal to the first direction and the second direction according to shapes and arrangement of the respective plural grooves and transmitted and received. In addition, a conductive member is joined to the end face having the grooves of the respective ultrasonic piezoelectric elements along the third direction.

(2) An ultrasonic probe includes: ultrasonic piezoelectric elements that are arranged at predetermined interval in a first direction and transmit and receive ultrasonic waves in a second direction substantially orthogonal to the first direction; and electrodes joined to two end faces substantially orthogonal to the second direction of the respective ultrasonic piezoelectric elements. The respective ultrasonic piezoelectric elements have plural grooves parallel to the first direction for weighting the ultrasonic waves in a third direction orthogonal to the first direction and the second direction and transmitting and receiving the ultrasonic waves on at least one end face of two end faces substantially orthogonal to the second direction. The electrodes joined to the end face having the plural grooves of the two end faces of the respective ultrasonic piezoelectric elements are divided into plural electrodes by the plural grooves. The divided plural electrodes are coupled by a conductive member.

(3) In the ultrasonic probe described in (1), the plural grooves are formed substantially in the same depth and arranged at intervals gradually reducing in size toward both sides in the third direction.

(4) In the ultrasonic probe described in (2), the plural grooves are formed substantially in the same depth and arranged at intervals gradually reducing in size toward both sides in the third direction.

(5) In the ultrasonic probe described in (1), the plural grooves are formed at substantially the same intervals in the third direction and depth of the grooves gradually increases toward both sides in the third direction.

(6) In the ultrasonic probe described in (2), the plural grooves are formed at substantially the same intervals in the third direction and depth of the grooves gradually increases toward both sides in the third direction.

(7) In the ultrasonic probe described in (1), the respective grooves are formed round in bottoms thereof.

(8) In the ultrasonic probe described in (2), the respective grooves are formed round in bottoms thereof.

(9) In the ultrasonic probe described in (1), the conductive member is joined by a nonconductive adhesive filled in the plural grooves.

(10) In the ultrasonic probe described in (2), the conductive member is joined by a nonconductive adhesive filled in the plural grooves.

(11) An ultrasonic probe includes: plural ultrasonic piezoelectric elements that are arranged at predetermined intervals in a first direction and transmit and receive ultrasonic waves in a second direction substantially orthogonal to the first direction; and an acoustic matching layer having electrical conductivity that is provided on one end face of two end faces substantially orthogonal to the second direction of the ultrasonic piezoelectric elements. The ultrasonic piezoelectric elements and the acoustic matching layer have plural grooves that are substantially parallel to the first direction and extend from the other end face of the ultrasonic piezoelectric elements to the middle of the acoustic matching layer. The ultrasonic waves are weighted in a third direction orthogonal to the first direction and the second direction and transmitted and received.

(12) An ultrasonic probe includes: plural ultrasonic piezoelectric elements that are arranged at predetermined intervals in a first direction and transmit and receive ultrasonic waves in a second direction substantially orthogonal to the first direction; and an acoustic matching layer having electrical conductivity that is provided on one end face of two end faces substantially orthogonal to the second direction of the ultrasonic piezoelectric elements. The ultrasonic piezoelectric elements and the acoustic matching layer have plural grooves that are substantially parallel to the first direction and extend from an end face of the acoustic matching layer on the opposite side of the ultrasonic piezoelectric elements to the middle of the ultrasonic piezoelectric elements. The ultrasonic waves are weighted in a third direction orthogonal to the first direction and the second direction and transmitted and received.

(13) In the ultrasonic probe described in (11), a drive voltage is applied to the ultrasonic piezoelectric elements via the acoustic matching layer.

(14) In the ultrasonic probe described in (12), a drive voltage is applied to the ultrasonic piezoelectric elements via the acoustic matching layer.

(15) An ultrasonic diagnostic apparatus includes: an ultrasonic probe that transmits ultrasonic waves to and receives ultrasonic waves from a patient; and an image creating device that creates an ultrasonic image of the patient on the basis of the ultrasonic waves received by the ultrasonic probe. The ultrasonic probe includes ultrasonic piezoelectric elements that are arranged in a first direction at predetermined intervals and transmit and receive ultrasonic waves in a second direction substantially orthogonal to the first direction. The respective ultrasonic piezoelectric elements have plural grooves, which are parallel to the first direction and do not pierce through an end face, on at least one end face of two end faces substantially orthogonal to the second direction of the respective ultrasonic piezoelectric elements. The ultrasonic waves are weighted in a third direction orthogonal to the first direction and the second direction according to shapes and arrangement of the respective plural grooves and transmitted and received. In addition, a conductive member is joined to the end face having the grooves of the respective ultrasonic piezoelectric elements along the third direction.

(16) An ultrasonic diagnostic apparatus includes: an ultrasonic probe that transmits ultrasonic waves to and receives ultrasonic waves from a patient; and an image creating device that creates an ultrasonic image of the patient on the basis of the ultrasonic waves received by the ultrasonic probe. The ultrasonic probe includes: ultrasonic piezoelectric elements that are arranged at predetermined interval in a first direction and transmit and receive ultrasonic waves in a second direction substantially orthogonal to the first direction; and electrodes joined to two end faces substantially orthogonal to the second direction of the respective ultrasonic piezoelectric elements. The respective ultrasonic piezoelectric elements have plural grooves parallel to the first direction for weighting the ultrasonic waves in a third direction orthogonal to the first direction and the second direction and transmitting and receiving the ultrasonic waves on at least one end face of two end faces substantially orthogonal to the second direction. The electrodes joined to the end face having the plural grooves of the two end faces of the respective ultrasonic piezoelectric elements are divided into plural electrodes by the plural grooves. The divided plural electrodes are coupled by a conductive member.

(17) An ultrasonic diagnostic apparatus includes: an ultrasonic probe that transmits ultrasonic waves to and receives ultrasonic waves from a patient; and an image creating device that creates an ultrasonic image of the patient on the basis of the ultrasonic waves received by the ultrasonic probe. The ultrasonic probe includes: plural ultrasonic piezoelectric elements that are arranged at predetermined intervals in a first direction and transmit and receive ultrasonic waves in a second direction substantially orthogonal to the first direction; and an acoustic matching layer having electrical conductivity that is provided on one end face of two end faces substantially orthogonal to the second direction of the ultrasonic piezoelectric elements. The ultrasonic piezoelectric elements and the acoustic matching layer have plural grooves that are substantially parallel to the first direction and extend from the other end face of the ultrasonic piezoelectric elements to the middle of the acoustic matching layer. The ultrasonic waves are weighted in a third direction orthogonal to the first direction and the second direction and transmitted and received.

(18) An ultrasonic diagnostic apparatus includes: an ultrasonic probe that transmits ultrasonic waves to and receives ultrasonic waves from a patient; and an image creating device that creates an ultrasonic image of the patient on the basis of the ultrasonic waves received by the ultrasonic probe. The ultrasonic probe includes: plural ultrasonic piezoelectric elements that are arranged at predetermined intervals in a first direction and transmit and receive ultrasonic waves in a second direction substantially orthogonal to the first direction; and an acoustic matching layer having electrical conductivity that is provided on one end face of two end faces substantially orthogonal to the second direction of the ultrasonic piezoelectric elements. The ultrasonic piezoelectric elements and the acoustic matching layer have plural grooves that are substantially parallel to the first direction and extend from an end face of the acoustic matching layer on the opposite side of the ultrasonic piezoelectric elements to the middle of the ultrasonic piezoelectric elements. The ultrasonic waves are weighted in a third direction orthogonal to the first direction and the second direction and transmitted and received.

According to the invention, it is possible to reduce side lobes without complicating the apparatus structure and the manufacturing process. In addition, it is possible to uniformalize sound fields without complicating the apparatus structure and the manufacturing process. Moreover, it is possible to improve reliability of the ultrasonic probe.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a sectional view showing the ultrasonic probe according to the embodiment cut along an array direction;

FIG. 4 is a schematic diagram showing a sine function that determines pitch intervals of grooves according to the embodiment;

FIG. 18 is a sectional view showing an ultrasonic probe according to a ninth embodiment of the invention cut along a lens direction;

FIG. 19 is a schematic diagram showing a structure of an ultrasonic diagnostic apparatus according to a tenth embodiment of the invention.

DETAILED DESCRIPTION OF THE INVENTION

Figure 1:
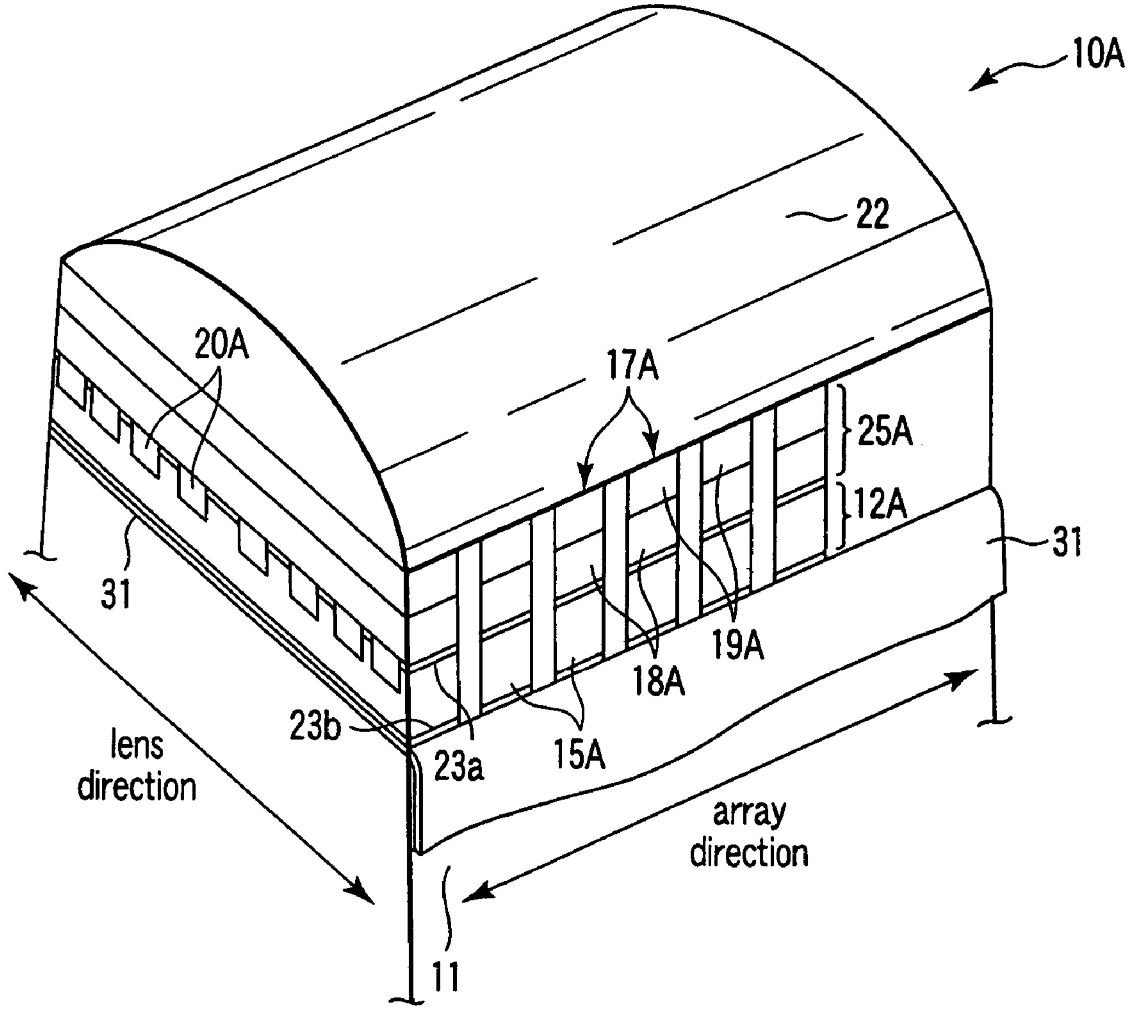
FIG. 1 is a perspective view showing a schematic structure of an ultrasonic probe according to a first embodiment of the invention.

First to tenth embodiments of the invention will be hereinafter explained with reference to the drawings. Note that, in the following explanation, components having substantially identical functions and structures are denoted by identical reference numerals and signs and the components are explained repeatedly only when the explanation is necessary.

First Embodiment

A first embodiment of the invention will be explained with reference to FIGS. 1 to 6.

[Structure of an Ultrasonic Probe 10A]

Figure 2:
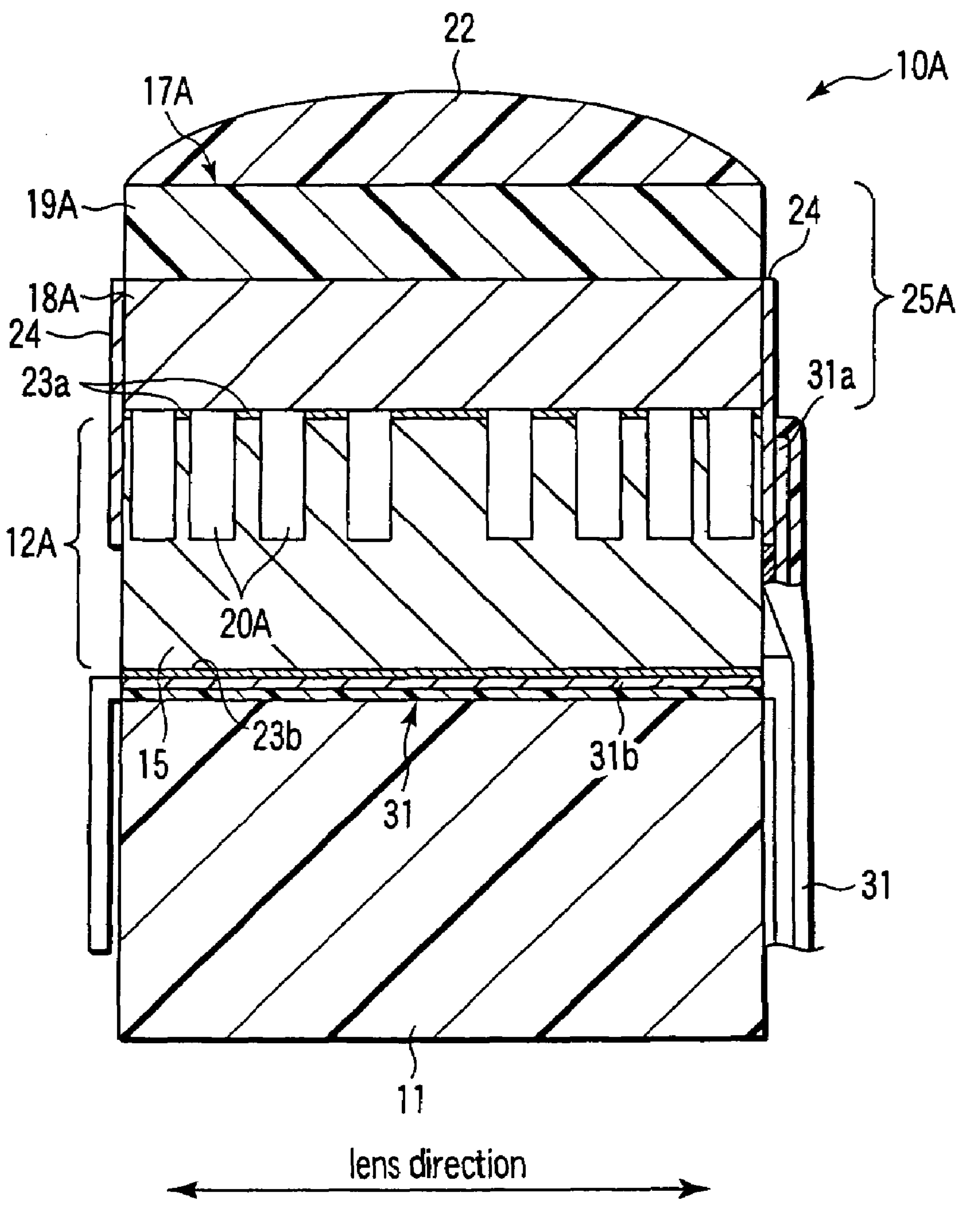
FIG. 2 is a sectional view showing the ultrasonic probe according to the embodiment cut along a lens direction.

First, a structure of an ultrasonic probe 10A according to this embodiment will be explained with reference to FIGS. 1 to 4. FIG. 1 is a perspective view showing a schematic structure of the ultrasonic probe 10A according to this embodiment. FIG. 2 is a sectional view showing the ultrasonic probe 10A according to this embodiment cut along a lens direction. FIG. 3 is a sectional view showing the ultrasonic probe 10A according to this embodiment cut along an array direction.

As shown in FIGS. 1 to 3, the ultrasonic probe 10A is a so-called linear array ultrasonic probe and includes a back member 11 having a sound absorbing action. This back member 11 is formed in a rectangular block shape. A piezoelectric element unit 12A is provided on one side surface of the back member 11 via a flexible printed wiring board 31.

The piezoelectric element unit 12A includes plural piezoelectric elements 15A (ultrasonic piezoelectric elements) formed in a strip shape. These piezoelectric elements 15A are arranged in a first direction at fixed intervals. The respective piezoelectric elements 15A form so-called channels that transmit and receive ultrasonic waves. The first direction will be hereinafter referred to as an array direction.

As a material of the piezoelectric elements 15A, piezoelectric ceramics or piezoelectric monocrystal is used. Note that the respective piezoelectric elements 15A are polarized in a second direction orthogonal to the array direction in a manufacturing process thereof. The second direction will be hereinafter referred to as a vertical direction.

Ground electrodes 23*a* (electrodes) and signal electrodes 23*b* (electrodes) are provided on upper end faces and lower end faces of the respective piezoelectric elements 15A, respectively. The ground electrodes 23*a* and the signal electrodes 23*b* are formed of a metal foil such as a copper foil such that drive voltages are applied to the piezoelectric elements 15A from these electrodes 23*a* and 23*b*.

Plural grooves 20A (grooves) are formed on the upper end faces of the respective piezoelectric elements 15A. These grooves 20A are formed along the vertical direction. Pitch intervals in a third direction orthogonal to the array direction and the vertical direction are determined on the basis of a sine function S. The third direction will be hereinafter referred to as a lens direction.

FIG. 4 is a schematic diagram showing the sine function S for determining the pitch intervals of the grooves 20A. Note that, in FIG. 4, a horizontal axis indicates a position in the lens direction of the piezoelectric elements 15A (the center in the lens direction is indicated by 0) and S indicates a function curve of the sine function.

As shown in FIG. 4, the pitch intervals in the lens direction of the grooves 20A are determined in accordance with a function value of the sine function S so as to increase toward the center in the lens direction and decrease toward the outer sides in the lens direction.

Although the pitch intervals in the lens direction of the grooves 20A are determined on the basis of the sine function S in this embodiment, the invention is not limited to this. For example, the pitch intervals may be determined on the basis of Gaussian and the like.

The signal electrodes 23*b* of the respective piezoelectric elements 15A are electrically connected to plural signal wirings 31*b* (described later) in the flexible printed wiring board 31, respectively. These signal wirings 31*b* are arranged at fixed intervals in the array direction such that drive signals can be applied to the plural piezoelectric elements 15A arranged in the array direction separately.

An acoustic matching unit 25A is provided on an upper surface of the piezoelectric element unit 12A. This acoustic matching unit 25A includes plural acoustic matching layers 17A formed in a strip shape. The respective acoustic matching layers 17A are arranged to be associated with the respective piezoelectric elements 15A.

This acoustic matching layers 17A are layers for matching acoustic impedances of the piezoelectric elements 15A and a human body. In this embodiment, the acoustic matching layers 17A include first acoustic matching layers 18A (conductive members) and second acoustic matching layers 19A, which are made of different materials, such that the acoustic impedances change stepwise from the piezoelectric elements 15A toward the human body.

The first acoustic matching layers 18A are formed of a conductive material and lower end faces thereof are electrically connected to the ground electrodes 23*a* on the piezoelectric elements 15A. On the other hand, the second acoustic matching layers 19A are formed of an insulating material and lower end faces thereof are joined to upper end faces of the first acoustic matching layers 18A.

In this embodiment, the acoustic matching layers 17A include the first acoustic matching layers 18A and the second acoustic matching layers 19A. However, the invention is not limited to this. For example, the acoustic matching layers 17A may include only the first acoustic matching layers 18A.

An acoustic lens 22 is provided over the second acoustic matching layers 19A so as to cover all the second acoustic matching layers 19A. This acoustic lens 22 is formed of silicone rubber or the like having an acoustic impedance close to that of a living body. The acoustic lens 22 converges ultrasonic beams using refraction of sounds and improves resolution.

In gaps among the piezoelectric elements 15A arranged in the array direction and insides of the grooves 20A formed in the respective piezoelectric elements 15A, a nonconductive resin material (a nonconductive adhesive) such as epoxy is filled. This nonconductive resin material gives mechanical strength to the piezoelectric element unit 12A and the acoustic matching unit 25A and joins the first acoustic matching layers 18A to the ground electrodes 23*a*.

Earth lead-out electrodes 24 are provided on sides of the respective first acoustic matching layers 18A. These earth lead-out electrodes 24 are electrically connected to the first acoustic matching layers 18A made of a conductive material and lower ends thereof are integrated with the flexible printed wiring board 31. Note that it is also possible that the second acoustic matching layers 19A are formed of a conductive material and the second acoustic matching layers 19A and the earth lead-out electrodes 24 are electrically connected.

The flexible printed wiring board 31 has a two-layer structure. An earth wiring 31*a* is provided in a first layer and the plural signal wirings 31*b* (described above) arranged at predetermined intervals in the array direction are provided in a second layer.

A leading end of the first layer is arranged on a side at a lower end of the earth lead-out electrode 24 and the earth wiring 31*a* and the earth lead-out electrode 24 are electrically connected. In addition, a leading end of the second layer is arranged between the back member 11 and the piezoelectric element unit 12A as described above and the signal wiring 31*b* and the signal electrode 23*b* are electrically connected.

[Manufacturing Process for the Ultrasonic Probe 10A]

Next, a manufacturing process for the ultrasonic probe 10A having the structure described above will be explained with reference to FIGS. 5A to 5H. FIGS. 5A to 5H are schematic diagrams showing the manufacturing process for the ultrasonic probe 10A according to this embodiment.

Figure 5A:
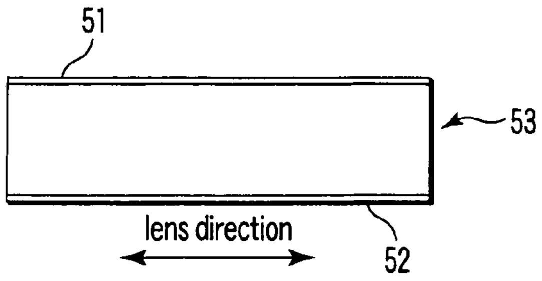
FIGS. 5A to 5H are schematic diagrams showing a manufacturing process for the ultrasonic probe according to the embodiment.

As shown in FIG. 5A, first, a piezoelectric block 53 including a first electrode 51 and a second electrode 52 is prepared. This piezoelectric block 53 is obtained by manufacturing a piezoelectric material such as piezoelectric ceramics or piezoelectric crystal with the usual piezoelectric body manufacturing method and, then, applying plating or sputtering of Au or the like to both sides of this piezoelectric material, and polarizing the piezoelectric material.

Figure 5B:
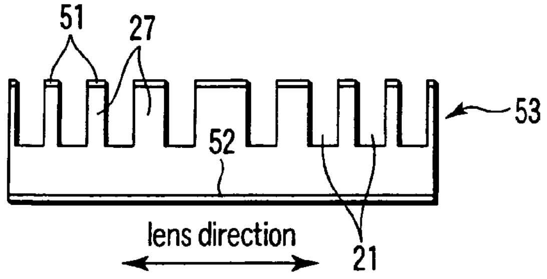

Next, as shown in FIG. 5B, the piezoelectric block 53 is subjected to dicing along the array direction from the first electrode 51 side. This dicing is dicing for so-called weighting. The dicing is executed to the middle of the piezoelectric block 53 such that pitch intervals increase toward the center in the lens direction on the basis of a function value of the sine function S. Consequently, the first electrode 51 side of the piezoelectric block 53 is divided into plural cut pieces 27 and groove rows 21 are formed among these cut pieces 27.

Figure 5C:
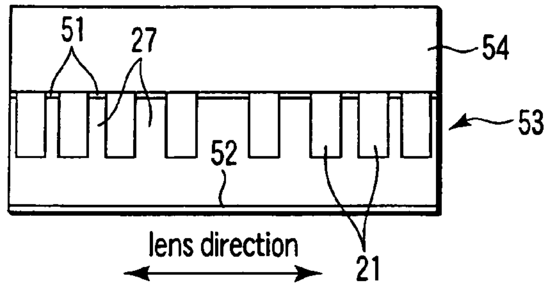
Figure 5D:
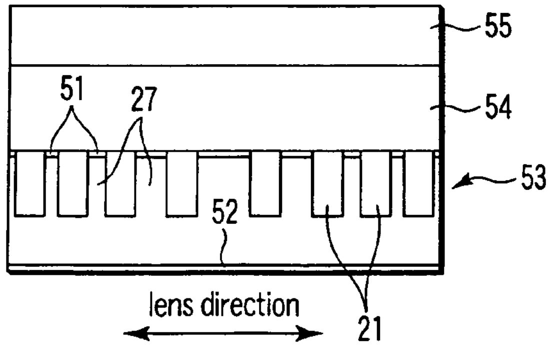

Next, as shown in FIG. 5C, the first acoustic matching material 54 is joined onto the piezoelectric block 53 by an epoxy adhesive or the like to electrically connect the first electrode 51 and the first acoustic matching material 54. Then, as shown in FIG. 5D, the second acoustic matching material 55 is joined onto the first acoustic matching material 54.

Figure 5E:
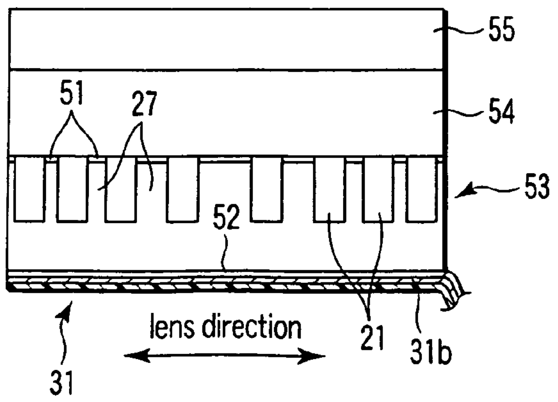

Next, as shown in FIG. 5E, the flexible printed wiring board 31 is joined to the second electrode 52 to electrically connect the signal wiring 31*b* of the flexible printed wiring board 31 and the second electrode 52.

Figure 5F:
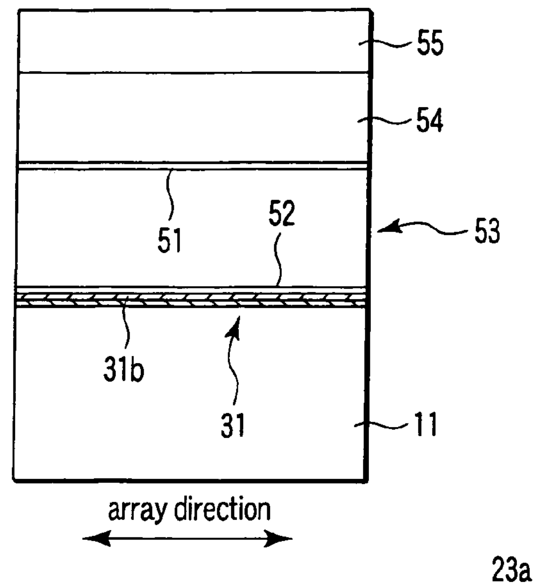
Figure 5G:
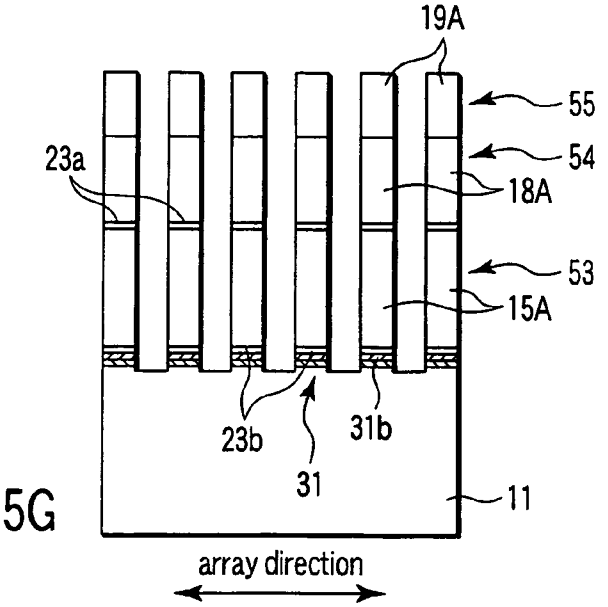

Next, as shown in FIG. 5F, the back member 11 is joined to the flexible printed wiring board 31 joined to the piezoelectric block 53. As shown in FIG. 5G, the piezoelectric block 53, the first acoustic matching material 54, the second acoustic matching material 55, and the flexible printed wiring board 31 are subjected to dicing from the second acoustic matching material 55 side along the lens direction.

This dicing is dicing for so-called arraying. The dicing is executed at fixed pitch intervals in the array direction until the flexible printed wiring board 31 is completely cut. Consequently, the piezoelectric block 53, the first acoustic matching material 54, the second acoustic matching material 55, the first electrode 51, the second electrode 52, and the flexible printed wiring board 31 are separated completely in the array direction and gaps are formed among these separated parts.

By performing the dicing twice, the piezoelectric block 53 changes to the plural piezoelectric elements 15A, the first acoustic matching material 54 is changed to the plural first acoustic matching layers 18A, the second acoustic matching material 55 is changed to the plural second acoustic matching layers 19A, the first electrode 51 changes to the plural ground electrodes 23*a*, the second electrode 52 changes to the plural signal electrodes 23*b*, and the groove rows 21 change to the plural grooves 20A.

Note that, even if the piezoelectric block 53, the first acoustic matching material 54, the second acoustic matching material 55, the first electrode 51, the second electrode 52, and the flexible printed wiring board 31 are separated completely, since the back member 11 is joined to the piezoelectric block 53 via the flexible printed wiring board 31, the respective parts never separate into pieces.

Figure 5H:
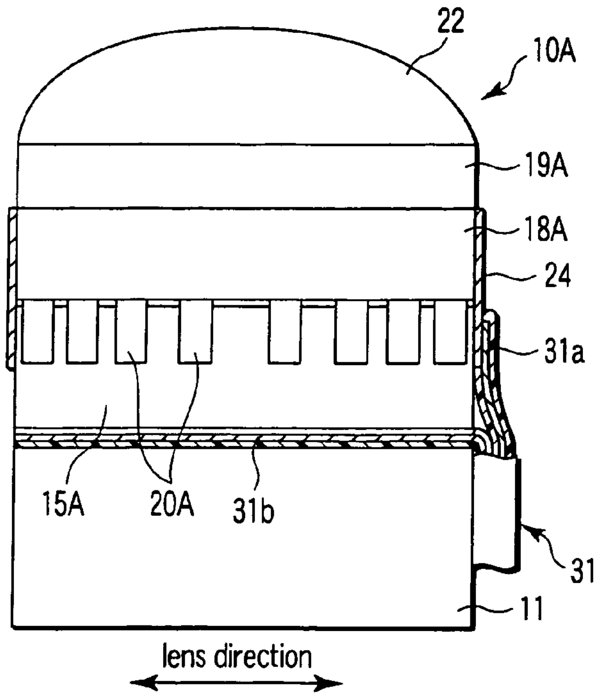

Next, as shown in FIG. 5H, the acoustic lens 22 is joined onto the second acoustic matching layers 19A and the earth lead-out electrode 24 is joined to the sides of the first acoustic matching layers 18A by the conductive adhesive. Finally, the earth lead-out electrode 24 and the earth wiring 31*a* of the flexible printed wiring board 31 are electrically connected. Consequently, the ultrasonic probe 10A is completed.

[Actions According to this Embodiment]

According to the ultrasonic probe 10A having the structure described above, the plural grooves 20A formed in the respective piezoelectric elements 15A are only formed up to the middle of the piezoelectric elements 15A.

Therefore, when the dicing for weighting is applied to the piezoelectric block 53, the piezoelectric block 53 does not have to be separated completely. Thus, it is possible to simplify the manufacturing process for the ultrasonic probe 10A.

After the piezoelectric block 53 is formed, that is, after the first electrode 51 and the second electrode 52 are formed in the piezoelectric material, the dicing for weighting is applied to the piezoelectric block 53.

Therefore, it is unnecessary to stick the first electrode 51 on the nonconductive resin material in the manufacturing process for the ultrasonic probe 10A. Thus, it is possible to prevent adhesion intensity of the first electrode 51 to the piezoelectric material from falling. Consequently, it is possible to improve reliability in the ultrasonic probe 10A.

Incidentally, with such a structure, the ground electrodes 23*a* are separated for each of the cut pieces 27 of the piezoelectric elements 15A. Thus, with the conventional connection method, it is difficult to connect the ground electrodes 23*a* and the earth wiring 31*a*.

However, in this embodiment, since the first acoustic matching layers 18A are formed of the conductive material, the ground electrodes 23*a* are used in common and the ground electrodes 23*a* and the earth wiring 31*a* are connected via the first acoustic matching layers 18A.

Therefore, the connection structure and the arrangement structure of the earth wiring 31*a* are not complicated. Therefore, the structure of the ultrasonic probe 10A is simplified and, as a result, it is possible to simplify the manufacturing process.

Here, sound fields in the lens direction of ultrasonic waves transmitted from the ultrasonic probe 10A according to the embodiment are considered.

Figure 6:
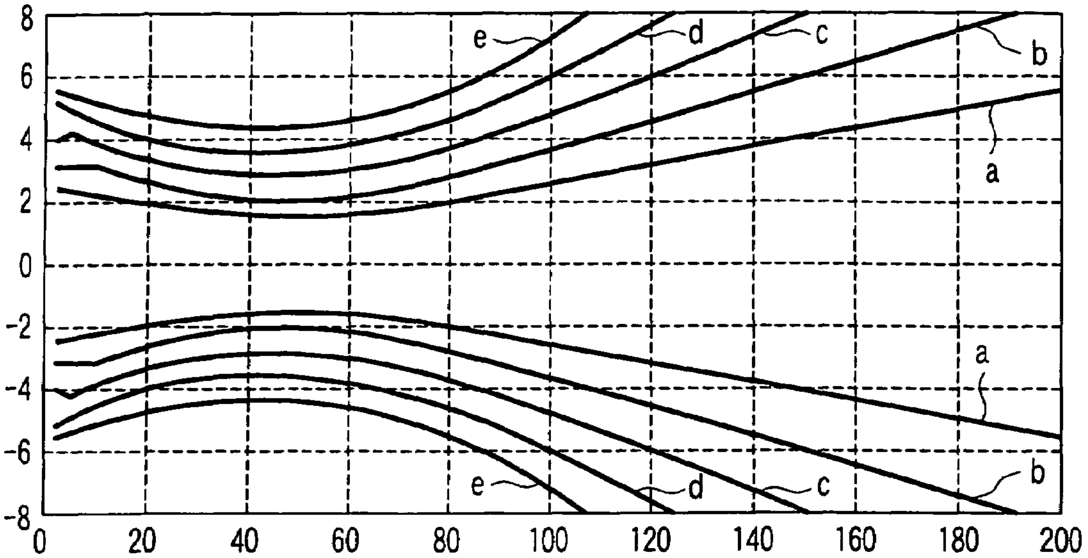
FIG. 6 is a distribution chart showing a transmission sound pressure distribution generated by the ultrasonic probe according to the embodiment.
Figure 20:
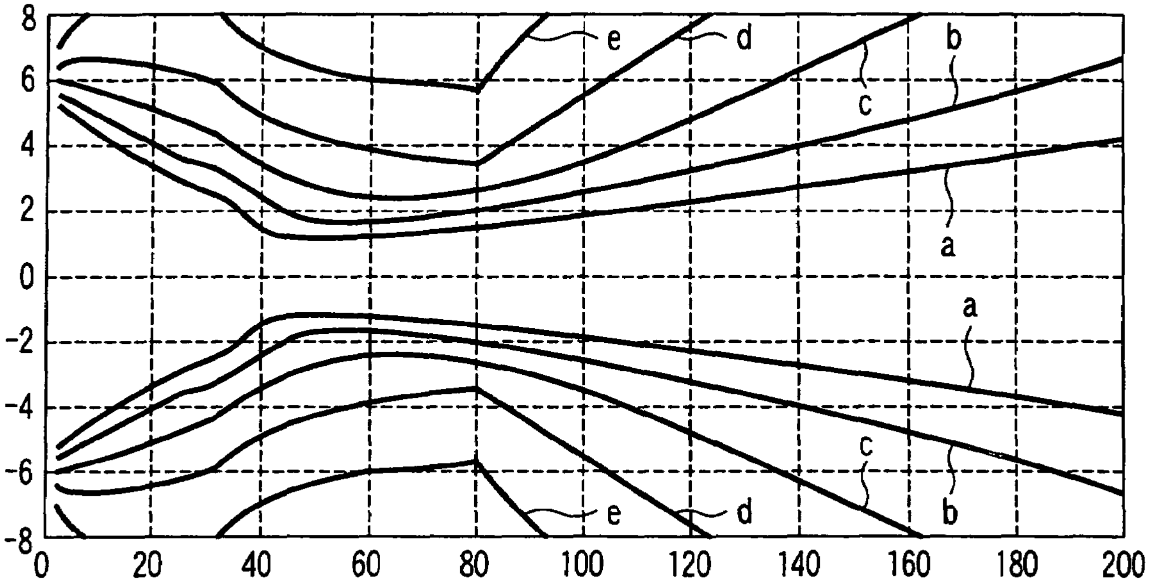
FIG. 20 is a distribution chart showing a transmission sound pressure distribution generated by a conventional ultrasonic probe.

FIG. 6 is a distribution chart showing a transmission sound pressure distribution generated by the ultrasonic probe 10A according to this embodiment. FIG. 20 is a distribution chart showing a transmission sound pressure distribution generated by the conventional ultrasonic probe 10A. Note that, in these figures, a horizontal axis indicates a distance in an axial line direction of the ultrasonic probe 10A measured from the acoustic lens 22, a vertical axis indicates a distance in the lens direction measured from the axial line of the ultrasonic probe 10A, and a to e indicate equal sound pressure lines (a relation among magnitudes of sound pressures is a>b>c>d>e).

When FIG. 6 and FIG. 20 are compared, it can be confirmed that the respective equal sound pressure lines a to e are close to the axial line side of the ultrasonic probe 10A when the ultrasonic probe 10A according to this embodiment is used. In particular, it is seen that the equal sound pressure lines in positions further apart from the axial line of the ultrasonic probe 10A such as the equal sound pressure lines d and e are closer to the axial line side of the ultrasonic probe 10A. This indicates that side lobes in the lens direction of ultrasonic waves transmitted from the ultrasonic probe 10A are reduced.

Moreover, it is possible to confirm that the respective equal sound pressure lines a to e are drawn as smooth curves by using the ultrasonic probe 10A according to this embodiment. This indicates the sound fields in the lens direction of ultrasonic waves transmitted from the ultrasonic probe 10A are uniformalized.

It is confirmed form the above results that, even when the grooves are formed only to the middle of the piezoelectric block 53, it is possible to reduce side lobes in the lens direction of ultrasonic waves transmitted from the ultrasonic probe 10A and uniformalize the sound fields in the lens direction.

It is seen that, near the ultrasonic probe 10A, compared with the conventional ultrasonic probe, the equal sound pressure lines are close to the axial line side of the ultrasonic probe 10A. This indicates that resolution of the ultrasonic waves transmitted from the ultrasonic probe 10A has increased.

Second Embodiment

Figure 7:
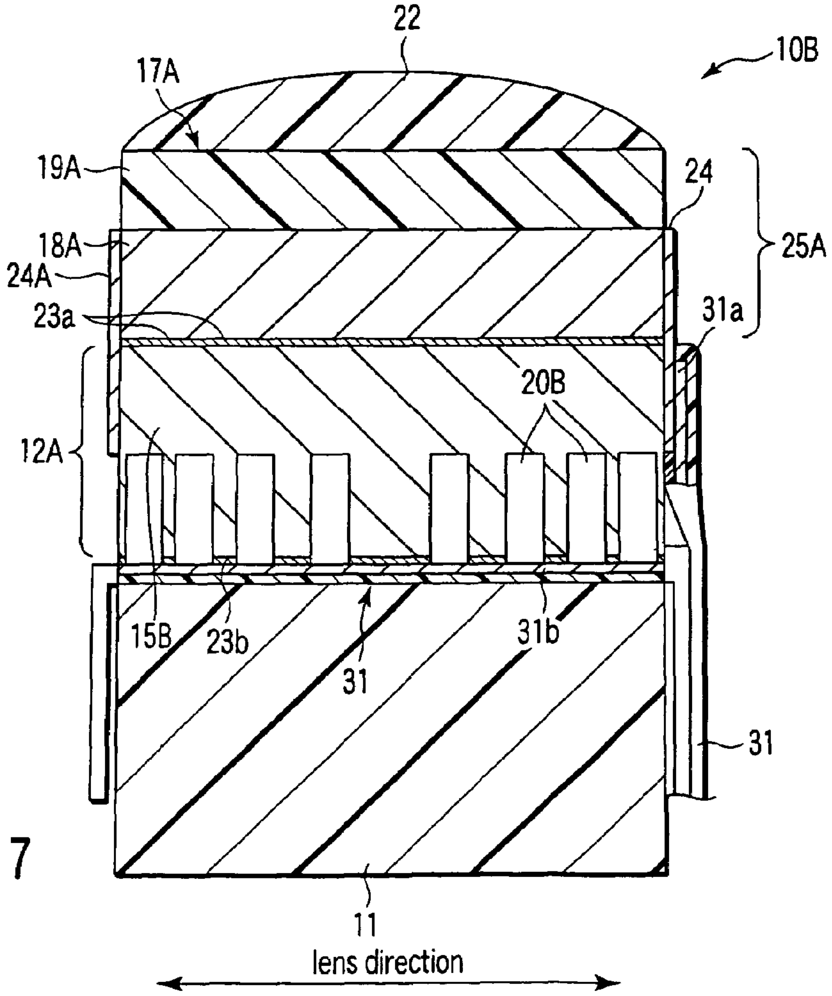
FIG. 7 is a sectional view showing an ultrasonic probe according to a second embodiment of the invention cut along a lens direction.

Next, a second embodiment of the invention will be explained with reference to FIG. 7. FIG. 7 is a sectional view showing an ultrasonic probe 10B according to the second embodiment of the invention cut along the lens direction. As shown in FIG. 7, in the ultrasonic probe 10B according to this embodiment, plural grooves 20B are formed on a lower end face of a piezoelectric element 15B.

With such a structure, it is possible to obtain advantages equivalent to those in the first embodiment, that is, simplification of a manufacturing process for the ultrasonic probe 10B, improvement in reliability in the ultrasonic probe 10B, reduction in side lobes in the lens direction of ultrasonic waves, uniformalization of sound fields in the lens direction of ultrasonic waves, improvement in resolution of ultrasonic waves, and the like.

Moreover, in this structure, since the ground electrode 23*a* is not divided, it is unnecessary to use the conductive material for the first acoustic matching layers 18A. Therefore, it is possible to select a material for the first acoustic matching layers 18A from a wider range of materials.

In this structure, the signal electrode 23*b* is divided into plural electrodes. However, these signal electrodes 23*b* are used in common electrically by the signal wiring 31*b* of the flexible printed wiring board 31. In other words, in this embodiment, the signal wiring 31*b* functions as a conductive member in the invention.

Third Embodiment

Figure 8:
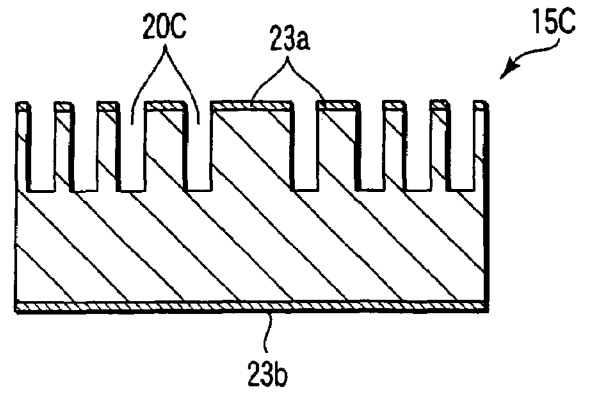
FIG. 8 is a sectional view showing a piezoelectric element according to a third embodiment of the invention.

Next, a third embodiment of the invention will be explained with reference to FIG. 8. FIG. 8 is a sectional view showing a piezoelectric element 15C according to the third embodiment. As shown in FIG. 8, nothing is filled in grooves 20C of the piezoelectric element 15C according to this embodiment. Since nothing is filled in the grooves 20C, it is possible to prevent ultrasonic waves propagating in the piezoelectric element 15C from causing acoustic crosstalk in the piezoelectric element 15C.

Fourth Embodiment

Figure 9:
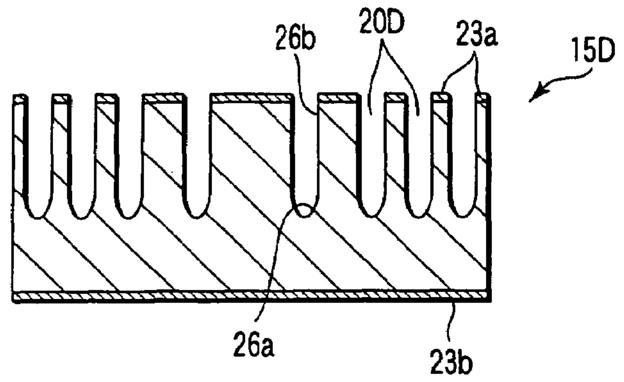
FIG. 9 is a sectional view showing a piezoelectric element according to a fourth embodiment of the invention.

Next, a fourth embodiment of the invention will be explained with reference to FIG. 9. FIG. 9 is a sectional view showing a piezoelectric element 15D according to the fourth embodiment. As shown in FIG. 9, grooves 20D of the piezoelectric element 15D according to this embodiment are formed round in bottom surfaces 26*a* (bottoms) and the bottom surfaces 26*a* and sides 26*b* are connected smoothly. Since the bottom surfaces 26*a* are formed round and the bottom surfaces 26*a* of the grooves 20D and the sides 26*b* are connected smoothly, it is possible to increase mechanical strength against cracks and the like due to a difference in coefficients of thermal expansion of a nonconductive resin material and the piezoelectric element 15D and impacts and the like from the outside.

Note that, in this embodiment, the bottom surfaces 26*a* of the grooves 20D are rounded. However, the invention is not limited to this. Most of the bottom surfaces 26*a* may be single-sided as long as the bottom surfaces 26*a* and the sides 26*b* are connected smoothly.

Fifth Embodiment

Figure 10:
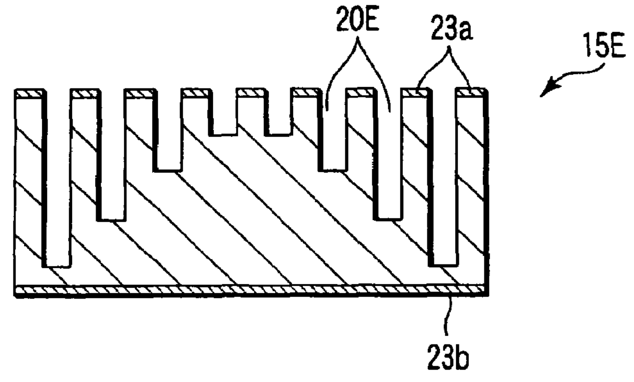
FIG. 10 is a sectional view showing a piezoelectric element according to a fifth embodiment of the invention.

Next, a fifth embodiment of the invention will be explained with reference to FIG. 10. FIG. 10 is a sectional view showing a piezoelectric element 15E according to the fifth embodiment. As shown in FIG. 10, grooves 20E of piezoelectric elements 15E according to this embodiment are formed at fixed pitch intervals in the lens direction and to become gradually deeper toward both sides in the lens direction. Note that depth of the grooves 20E is determined on the basis of a function value of the sine function S.

Incidentally, intensity of ultrasonic waves transmitted from the piezoelectric element 15E tends to weaken near the grooves 20E. Therefore, as in this embodiment, it is also possible to reduce side lobes of sound fields in the lens direction by forming the grooves 20E deeper toward both sides in the lens direction.

Note that, in this embodiment, depth in the lens direction of the grooves 20E is determined on the basis of a function value of the sine function S. However, the invention is not limited to this and, for example, Gaussian and the like may be used.

Sixth Embodiment

Figure 11:
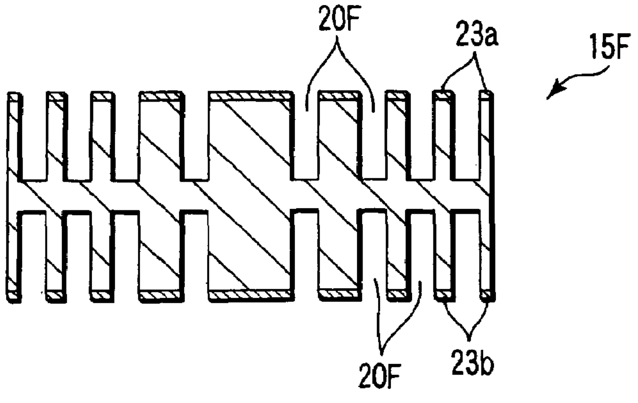
FIG. 11 is a sectional view showing a piezoelectric element according to a sixth embodiment of the invention.

Next, a sixth embodiment of the invention will be explained with reference to FIG. 11. FIG. 11 is a sectional view showing a piezoelectric element 15F according to the sixth embodiment. As shown in FIG. 11, grooves 20F of the piezoelectric element 15F according to this embodiment are formed on both an upper end face and a lower end face of the piezoelectric element 15F to face each other. Since the grooves 20F are formed on both the upper end face and the lower end face of the piezoelectric element 15F in this way, it is possible to further control acoustic crosstalk in the piezoelectric element 15F.

In addition, a shape of the piezoelectric element 15F is symmetrical with respect to a central line in a vertical direction thereof. Thus, even if there is a difference in coefficients of thermal expansion of the piezoelectric element 15F and a nonconductive resin material, it is possible to control warp caused in the piezoelectric element 15F by the difference.

Seventh Embodiment

Next, a seventh embodiment of the invention will be explained with reference to FIGS. 12 to 16.

[Structure of an Ultrasonic Probe 10C]

Figure 12:
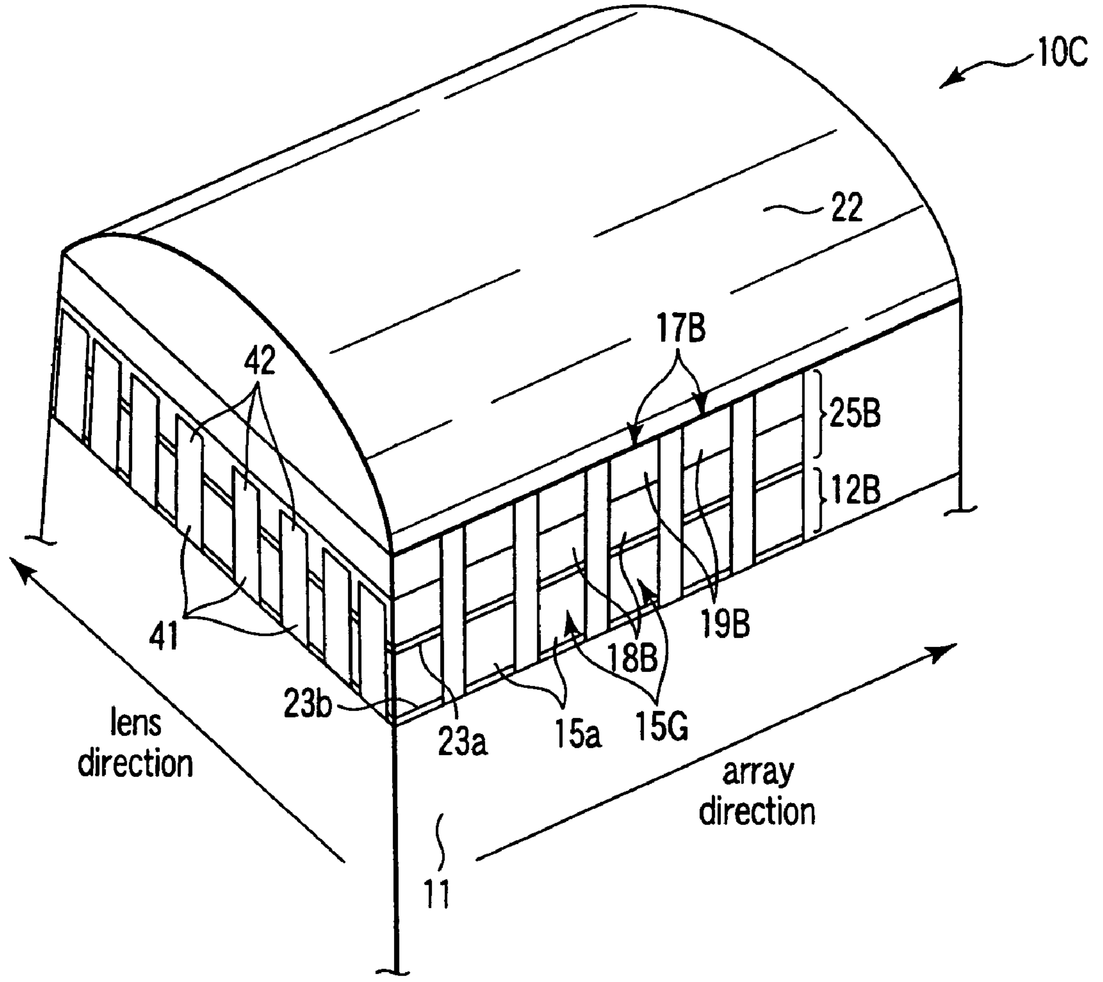
FIG. 12 is a perspective view showing a schematic structure of an ultrasonic probe according to a seventh embodiment of the invention.
Figure 13:
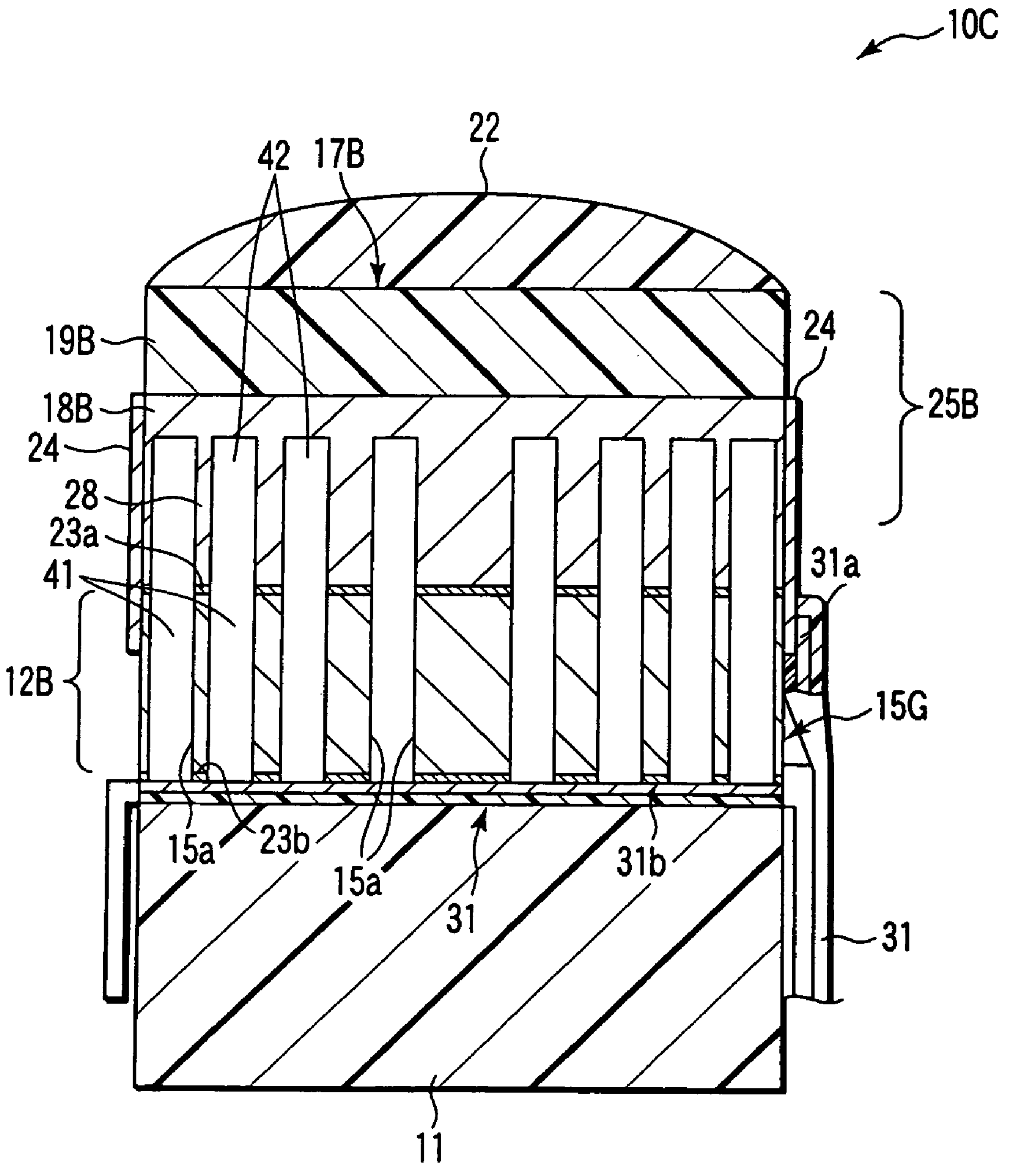
FIG. 13 is a sectional view showing the ultrasonic probe according to the embodiment cut along a lens direction.
Figure 14:
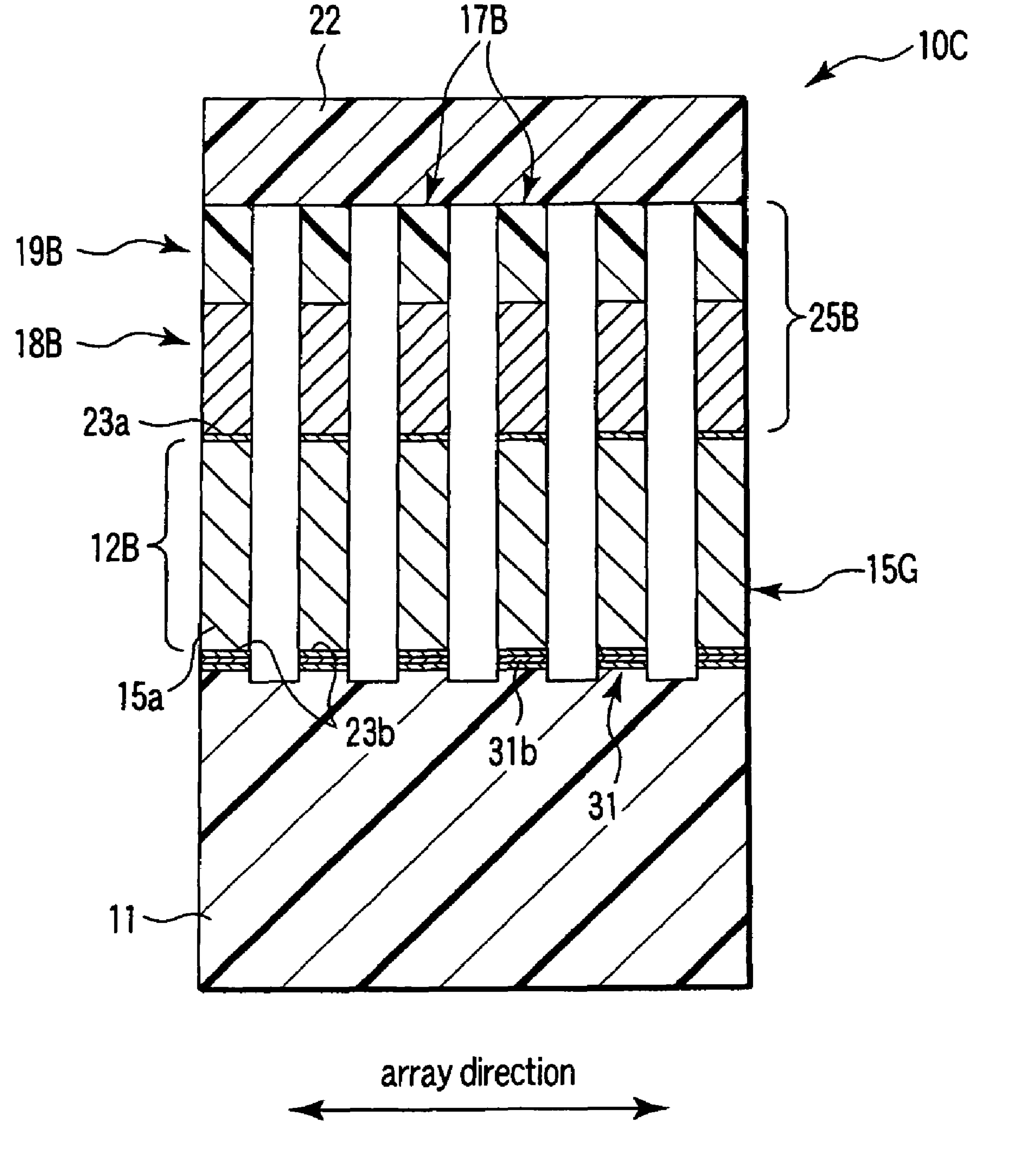
FIG. 14 is a sectional view showing the ultrasonic probe according to the embodiment cut along an array direction.

First, a structure of an ultrasonic probe 10C according to the seventh embodiment will be explained with reference to FIGS. 12 to 14. FIG. 12 is a perspective view showing a schematic structure of the ultrasonic probe 10C according to this embodiment. FIG. 13 is a sectional view of the ultrasonic probe 10C in this embodiment cut along the lens direction. FIG. 14 is a sectional view of the ultrasonic probe 10C according to this embodiment cut along the array direction.

As shown in FIGS. 12 to 14, the ultrasonic probe 10C is a so-called linear array ultrasonic probe C and has the back member 11 having a vibration absorbing function. This back member 11 is formed in a rectangular block shape and a piezoelectric element unit 12B is provided on one side thereof via the flexible printed wiring board 31.

The piezoelectric element unit 12B includes a large number of piezoelectric elements 15*a* formed in rectangular slim bar shape. These piezoelectric elements 15*a* are arranged at predetermined intervals in the first direction and the third direction orthogonal to each other and are arranged in a matrix shape as a whole. In the following explanation, the first direction will be referred to as the array direction and the third direction will be referred to as the lens direction.

The series of piezoelectric elements 15*a* arranged in the lens direction form one piezoelectric element layer 15G (an ultrasonic piezoelectric element) as a whole. Therefore, gaps among the plural piezoelectric elements 15*a* arranged in the lens direction can be regarded as plural gaps 41 formed in the piezoelectric element layer 15G. Note that the respective piezoelectric element layers 15G are equivalent to the piezoelectric elements 15A to 15F in the first to the sixth embodiments.

As a material of the piezoelectric elements 15*a*, piezoelectric ceramics and piezoelectric monocrystal are used. Note that the respective piezoelectric elements 15*a* are polarized in the second direction substantially orthogonal to the array direction and the lens direction in a manufacturing process therefor. The second direction will be hereinafter referred to as the vertical direction.

The piezoelectric elements 15*a* are formed such that a sectional area thereof substantially orthogonal to the vertical direction increases toward the outer sides in the lens direction and decreases toward the center in the lens direction in accordance with a function value of the sine function S shown in FIG. 4. In other words, a sectional area of the piezoelectric elements 15*a* arranged on the outer sides in the lens direction is smaller than a sectional area of the piezoelectric elements 15*a* arranged in the center in the lens direction.

The ground electrodes 23*a* and the signal electrodes 23*b* are provided on upper end faces and lower end faces of the respective piezoelectric elements 15*a*, respectively. The ground electrodes 23*a* and the signal electrodes 23*b* are formed of a metal foil such as a copper foil such that drive signals are applied to the piezoelectric elements 15*a* from these electrodes 23*a* and 23*b*.

The series of signal electrodes 23*b* arranged in the lens direction are electrically connected by the signal wirings 31*b* (described later) of the flexible printed wiring board 31. These signal wirings 31*b* are arranged at fixed intervals in the array direction such that the same drive signal can be applied to all the piezoelectric elements 15*a* arranged in the lens direction.

Ultrasonic waves traveling to the back member 11 side of ultrasonic waves generated in the respective piezoelectric elements 15*a* disappear according to the vibration absorbing action of the back member 11. Therefore, the ultrasonic waves generated in the piezoelectric elements 15*a* travel only to the opposite side of the back member 11.

When a rectangular voltage is applied to the respective signal wirings 31*b* as a drive signal, the same rectangular voltage is applied to all the piezoelectric elements 15*a* connected to the signal wirings 31*b*. However, in this embodiment, areas of the piezoelectric element layers 15G are varied in the lens direction. In other words, sectional areas substantially orthogonal to the vertical direction of the piezoelectric elements 15*a* are set large in the center in the lens direction and small in the outer sides in the lens direction. In this way, intensities of ultrasonic waves generated from the respective piezoelectric elements 15*a* are adjusted such that sound fields with low side lobes are obtained.

An acoustic matching unit 25B is provided on an upper surface of the piezoelectric element unit 12B. This acoustic matching unit 25B includes plural acoustic matching layers 17B formed in a strip shape. The respective acoustic matching layers 17B are arranged to be associated with the respective piezoelectric element layers 15G.

The acoustic matching layers 17B are layers for matching acoustic impedances of the piezoelectric elements 15*a* and a patient. In this embodiment, the acoustic matching layers 17B include the first acoustic matching layers 18B (acoustic matching layers) and the second acoustic matching layers 19B, which are made of different materials, such that the acoustic impedances change stepwise from the piezoelectric elements 15*a* toward the human body.

The first acoustic matching layers 18B are formed of a conductive material. In lower surfaces thereof, plural grooves 42 are formed in positions corresponding to the grooves 41 of the piezoelectric element layers 15G. Since the grooves 42 are formed, plural rectangular slim bar sections 28 projecting to the piezoelectric element unit 12B side are formed on the lower surfaces of the first acoustic matching layers 18B. Lower end faces of the rectangular slim bar section 28 are electrically connected to the ground electrodes 23*a* on the piezoelectric elements 15*a*, respectively.

The second acoustic matching layers 19B are formed in a strip shape and joined to upper surfaces of the first acoustic matching layers 18B, respectively. As a material of the second acoustic matching layers 19B, an insulating material is used.

The acoustic lens 22 is provided on the upper surfaces of the second acoustic matching layers 19B so as to cover all the second acoustic matching layers 19B. This acoustic lens 22 is formed of silicone rubber or the like having an acoustic impedance close to that of a living body. The acoustic lens 22 converges ultrasonic beams using refraction of sounds and improves resolution.

Earth lead-out electrodes 24 are provided on sides of the respective first acoustic matching layers 18B. These earth lead-out electrodes 24 are electrically connected to the first acoustic matching layers 18B made of a conductive material and lower ends thereof are connected to (described later) and integrated with the flexible printed wiring board 31 arranged on the side of the back member 11.

The flexible printed wiring board 31 has a two-layer structure. The earth wiring 31*a* is provided in a first layer and the plural signal wirings 31*b* arranged at predetermined intervals in the array direction are provided in a second layer.

A leading end of the first layer is arranged on a side at a lower end of the earth lead-out electrode 24 and the earth wiring 31*a* and the earth lead-out electrode 24 are electrically connected. In addition, a leading end of the second layer is arranged between the back member 11 and the piezoelectric element unit 12B as described above and the signal wiring 31*b* and the series of signal electrodes 23*b* arranged in the lens direction are electrically connected.

[Manufacturing Process for the Ultrasonic Probe 10C]

Next, a manufacturing process for the ultrasonic probe 10C having the structure described above will be explained with reference to FIGS. 15A to 15G. FIGS. 15A to 15G are schematic diagrams showing the manufacturing process for the ultrasonic probe 10C according to this embodiment.

Figure 15A:
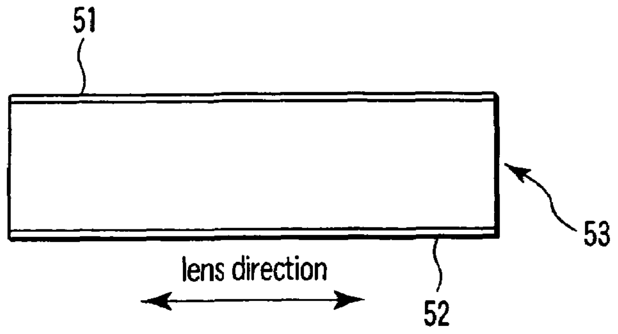
FIGS. 15A to 15G are schematic diagrams showing a manufacturing process of the ultrasonic probe according to the embodiment.

As shown in FIG. 15A, first, the piezoelectric block 53 including the first electrode 51 and the second electrode 52 is prepared. This piezoelectric block 53 is obtained by manufacturing a piezoelectric material such as piezoelectric ceramics or piezoelectric crystal with the usual piezoelectric body manufacturing method and, then, applying plating or sputtering of Au or the like to both sides of this piezoelectric material as the first and the second electrodes 51 and 52, and polarizing the piezoelectric material finally.

Figure 15B:
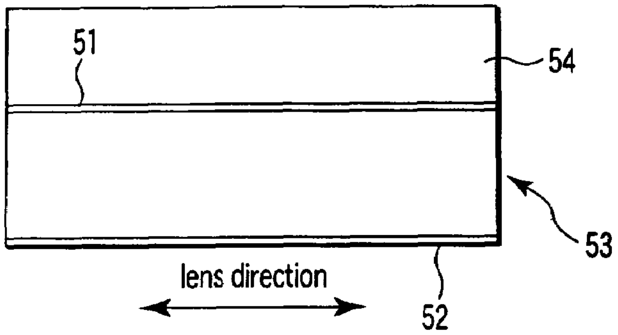

Next, as shown in FIG. 15B, the first acoustic matching material 54 is joined on the first electrode 51. The piezoelectric block 53 and the first acoustic matching material 54 are subjected to dicing along the array direction from the second electrode 52 side.

This dicing is dicing for so-called weighting. The dicing is executed to the middle of the first acoustic matching material 54 such that pitch intervals increase toward the center in the lens direction on the basis of a function value of the sine function S.

Figure 15C:
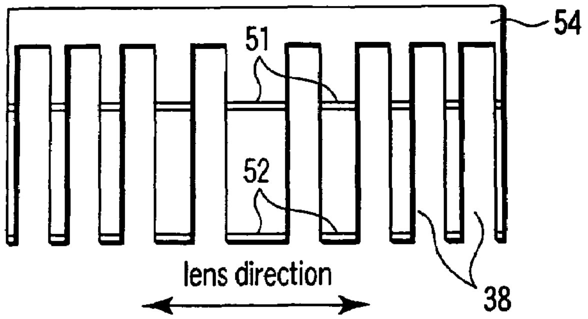

Consequently, as shown in FIG. 15C, grooves 38 for weighting are formed in the piezoelectric block 53 and the first acoustic matching material 54. Note that the grooves 38 are changed to grooves 41 and 42 by the dicing for arraying to be performed later.

Figure 15D:
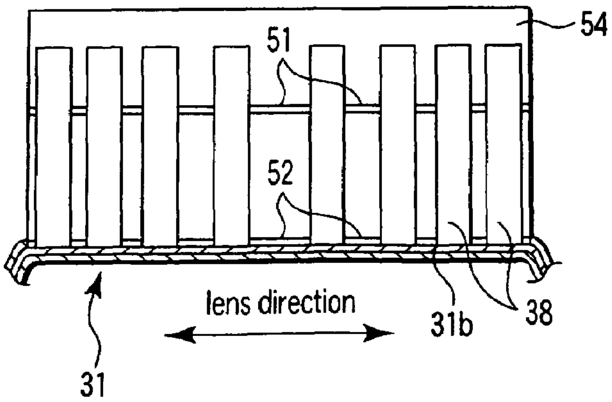

Next, as shown in FIG. 15D, the flexible printed wiring board 31 is joined to the first electrode 51 by a nonconductive adhesive such as epoxy resin. The second electrode 52, which is divided in the lens direction, is electrically connected by the signal wiring 31*b* of the flexible printed wiring board 31.

Figure 15E:
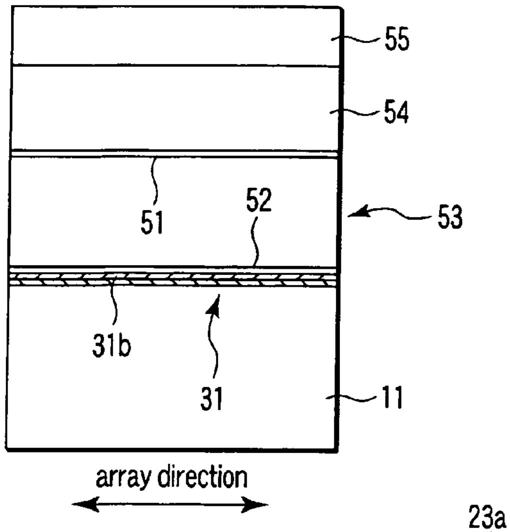

Next, as shown in FIG. 15E, the back member 11 and the second acoustic matching material 55 are joined to the flexible printed wiring board 31 and the first acoustic matching material 54 joined to the piezoelectric block 53, respectively. The piezoelectric block 53, the first acoustic matching material 54, and the second acoustic matching material 55 are subjected to dicing along the lens direction from the second acoustic matching material 55 side.

This dicing is dicing for so-called arraying. The dicing is executed at fixed pitch intervals in the array direction until the flexible printed wiring board 31 is completely cut. Consequently, the piezoelectric block 53, the first acoustic matching material 54, the second acoustic matching material 55, the first electrode 51, the second electrode 52, and the flexible printed wiring board 31 are separated completely in the array direction.

Figure 15F:
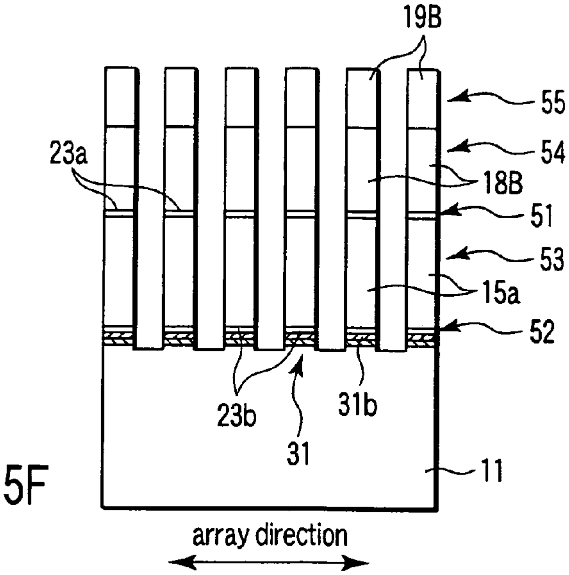

By performing the dicing twice, the piezoelectric block 53 changes to the plural piezoelectric elements 15, the first acoustic matching material 54 is changed to the plural first acoustic matching layers 18B, the second acoustic matching material 55 is changed to the plural second acoustic matching layers 19B, the first electrode 51 changes to the plural ground electrodes 23*a*, the second electrode 52 changes to the plural signal electrodes 23*b*, and the grooves 38 change to the grooves 41 and 42, as shown in FIG. 15F.

Note that, even if the piezoelectric block 53, the first acoustic matching material 54, the second acoustic matching material 55, the first electrode 51, the second electrode 52, and the flexible printed wiring board 31 are separated completely, since the back member 11 is joined to the piezoelectric block 53 via the flexible printed wiring board 31, the respective parts never separate into pieces.

Figure 15G:
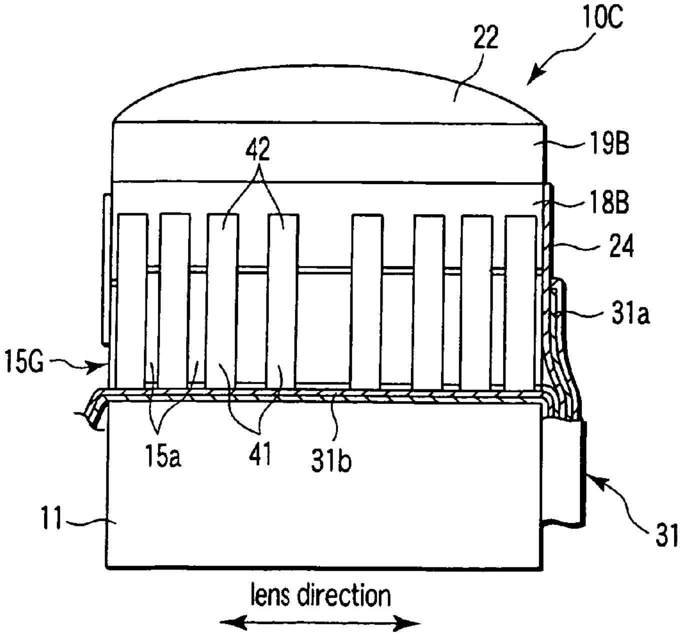

Next, as shown in FIG. 15G, the acoustic lens 22 is joined onto the second acoustic matching layers 19B and the earth lead-out electrode 24 is joined to the sides of the first acoustic matching layers 18B by the nonconductive adhesive such as epoxy resin. The earth lead-out electrode 24 and the earth wiring 31*a* of the flexible printed wiring board 31 are electrically connected. Consequently, the ultrasonic probe 10C is completed.

Note that, when the earth lead-out electrode 24 is joined to the first acoustic matching layer 18B by the nonconductive adhesive such as epoxy resin, all of these components may be placed in a vacuum furnace to fill the grooves 41 and 42 and spaces among the piezoelectric element layers 15G with the nonconductive adhesive. In addition, the grooves 41 and 42 and the spaces among the piezoelectric element layers 15G may be kept hollow using a film-like adhesive or the like.

[Actions According to this Embodiment]

According to the ultrasonic probe 10C having the structure described above, when the dicing for weighting is performed, the grooves 38 are formed not only in the piezoelectric block 53 but also in the first acoustic matching material 54. Therefore, ultrasonic waves generated from the piezoelectric elements 15 never cause acoustic crosstalk in the first acoustic matching layer 18B. Thus, it is possible to reduce side lobes in sound fields in the lens direction. Moreover, the dicing for weighting, which has been performed conventionally, only has to be executed slightly deeper than in the past, that is, to the middle of the first acoustic matching material 54. Thus, it is unnecessary to complicate the apparatus and the manufacturing process.

Figure 16:
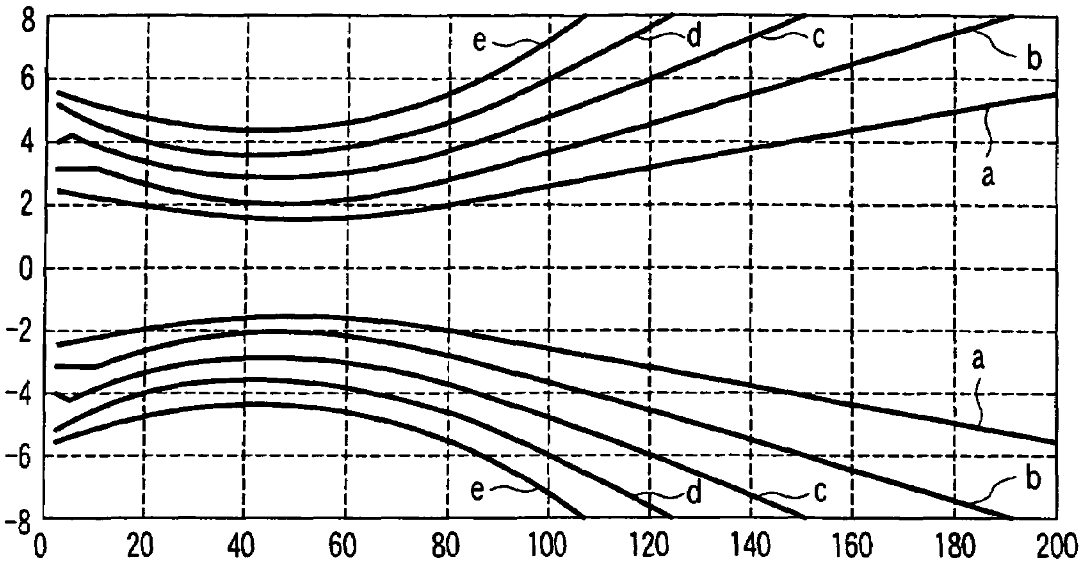
FIG. 16 is a distribution chart showing a transmission sound pressure distribution generated by the ultrasonic probe according to the embodiment.

FIG. 16 is a distribution chart showing a transmission sound pressure distribution generated by the ultrasonic probe 10C according to this embodiment. FIG. 20 is a distribution chart showing a transmission sound pressure distribution generated by the conventional ultrasonic probe. Note that, in these figures, a horizontal axis indicates a distance in an axial line direction of the ultrasonic probe 10C measured from the acoustic lens 22, a vertical axis indicates a distance in the lens direction measured from the axial line of the ultrasonic probe 10C, and a to e indicate equal sound pressure lines (a relation among magnitudes of sound pressures is a>b>c>d>e).

When FIG. 6 and FIG. 20 are compared, it can be confirmed that the respective equal sound pressure lines a to e generated by transmission of ultrasonic waves are close to the axial line side of the ultrasonic probe 10C when the ultrasonic probe 10C according to this embodiment is used.

In particular, it is seen that the equal sound pressure lines in positions further apart from the axial line of the ultrasonic probe 10C such as the equal sound pressure lines d and e are closer to the axial line side of the ultrasonic probe 10C. This indicates that side lobes in the lens direction of ultrasonic waves transmitted from the ultrasonic probe 10C are reduced.

Moreover, it is seen that, near the ultrasonic probe 10C, compared with the conventional ultrasonic probe, the equal sound pressure lines are considerably close to the axial line side of the ultrasonic probe 10C. This indicates that resolution of ultrasonic waves transmitted from the ultrasonic probe 10C has increased.

With such a structure, since the ground electrodes 23*a* are separated for each of the piezoelectric element 15, in the conventional connection method, it is difficult to connect the ground electrodes 23*a* and the earth wiring 31*a*.

However, in this embodiment, the first acoustic matching layer 18B is formed of a conductive material. Moreover, the ground electrodes 23*a* are used in common by leaving a part of the first acoustic matching layers 18B when the dicing for weighting is performed. The ground electrodes 23*a* and the earth wiring 31*a* are connected via the first acoustic matching layer 18B.

Therefore, since the connection structure and the arrangement structure of the earth wiring 31*a* are not complicated, it is possible to simplify the structure of the ultrasonic probe 10C and simplify the manufacturing process.

Eighth Embodiment

Figure 17:
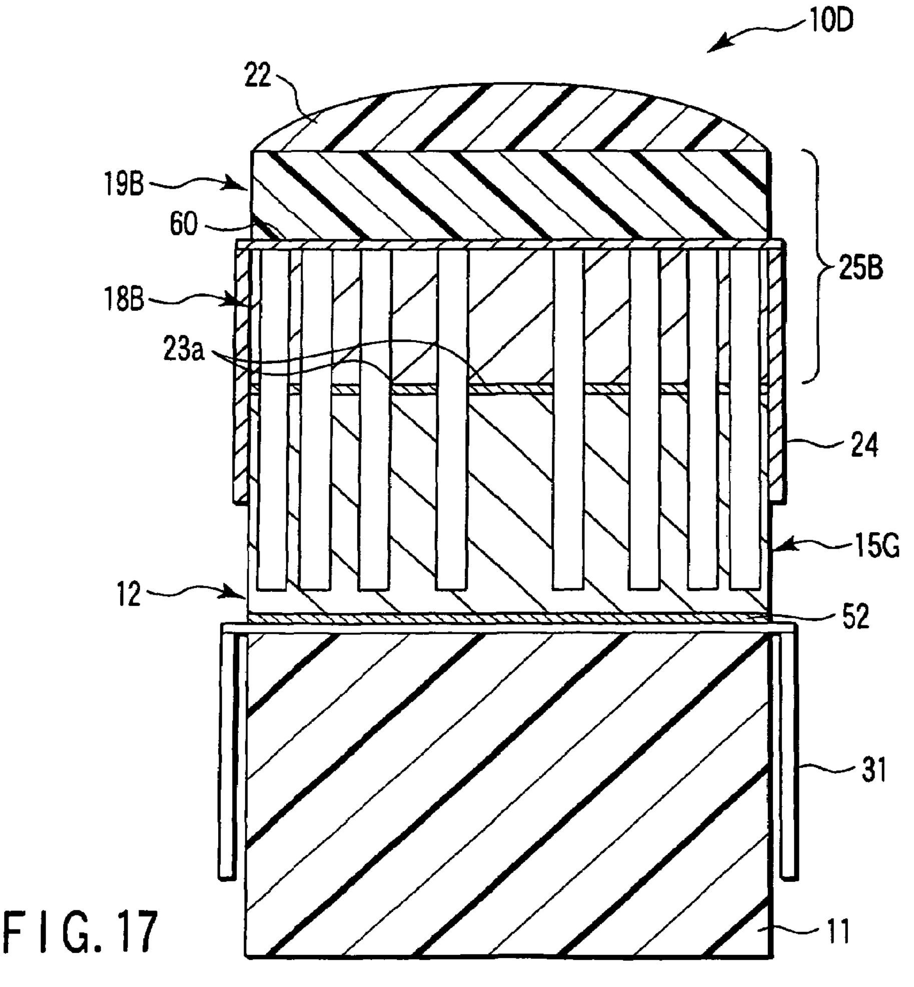
FIG. 17 is a sectional view showing an ultrasonic probe according to an eighth embodiment of the invention cut along a lens direction.

Next, an eighth embodiment of the invention will be explained with reference to FIG. 17. In an ultrasonic probe 10D according to this embodiment, when the dicing for weighting is applied to the piezoelectric block 53 and the first acoustic matching material 54, the dicing is executed to the middle of the piezoelectric block 53 from the first acoustic matching material 54 side rather than from the second electrode 52 side.

Even with such a structure, the piezoelectric block 53 and the first acoustic matching material 54 are separated leaving a part on the back member 11 side of the piezoelectric block 53. Thus, it is possible to reduce side lobes of sound fields in the lens direction as in the seventh embodiment.

Incidentally, in this embodiment, the first acoustic matching material 54 is completely separated. Thus, in order to take ground connection from all the ground electrodes 23*a* of the respective piezoelectric element layers 15G, as shown in FIG. 17, a common use electrode 60 is arranged between the first acoustic matching layer 18B and the second acoustic matching layer 19B to use the plural ground electrodes 23*a* common with this common use electrode 60. Consequently, it is possible to electrically connect the divided plural ground electrodes 23*a* and the earth wiring 31*a* of the flexible printed wiring board 31 easily.

Ninth Embodiment

Next, a ninth embodiment of the invention will be explained with reference to FIG. 18. FIG. 18 is a sectional view of an ultrasonic probe 10E according to the ninth embodiment cut along the lens direction. In the ultrasonic probe 10E according to this embodiment, dicing is applied not only to the piezoelectric block 53 and the first acoustic matching material 54 but also to the second acoustic matching material 55. This dicing is executed to the middle of the piezoelectric block 53 from the second acoustic matching material 55 side.

With such a structure, it is possible to prevent ultrasonic waves transmitted from the piezoelectric element layer 15 G from causing acoustic cross talk in the second acoustic matching layer 19B. Thus, it is possible to further reduce side lobes of sound fields in the lens direction.

Incidentally, in this embodiment, the first acoustic matching material 54 and the second acoustic matching material 55 are completely divided. Thus, in order to take ground connection from all the ground electrodes 23*a* of the respective piezoelectric element layers 15G, as shown in FIG. 18, the second acoustic matching material 55 is formed of a conductive material and the common use electrode 60 is arranged between the second acoustic matching material 55 and the acoustic lens 22. Consequently, it is possible to electrically connect the divided plural ground electrodes 23*a* and the earth wiring 31*a* of the flexible printed wiring board 31 easily.

Tenth Embodiment

Next, a tenth embodiment of the invention will be explained with reference to FIG. 19.

[Structure of an Ultrasonic Diagnostic Apparatus]

First, a structure of an ultrasonic diagnostic apparatus according to the tenth embodiment will be explained with reference to FIG. 19. FIG. 19 is a schematic diagram showing a structure of the ultrasonic diagnostic apparatus according to the tenth embodiment.

As shown in FIG. 19, the ultrasonic diagnostic apparatus includes the ultrasonic probe 10A according to the first embodiment, a transmission and reception unit 110, an image processing unit 120, a display unit 130, a control unit 140, and an operation unit 150.

The transmission and reception unit 110 outputs a drive signal to the ultrasonic probe 10A and receives a reception signal corresponding to a reflected wave received by the ultrasonic probe 10A. The image processing unit 120 receives the reception signal from the transmission and reception unit 110 and forms an image signal on the basis of this reception signal. The display unit 130 receives the image signal from the image processing unit 120 and displays an image on the basis of this image signal. The control unit 140 receives operation information from the operation unit 150 and controls the transmission and reception unit 110, the image processing unit 120, and the display unit 130 on the basis of this operation information.

[Method of Using the Ultrasonic Diagnostic Apparatus]

When a medical practitioner uses the ultrasonic diagnostic apparatus having the structure described above, the medical practitioner grips the ultrasonic probe 10 and places the acoustic lens 22 provided at the tip of the ultrasonic probe 10 on an inspection region of a patient h. Next, the ultrasonic diagnostic apparatus transmits ultrasonic waves to the patient h from the ultrasonic probe 10 and receives ultrasonic waves reflected in the body of the patient h. The ultrasonic diagnostic apparatus creates an ultrasonic image indicating an internal structure of the patient h on the basis of the received ultrasonic waves and causes the display unit 130 to display the ultrasonic image. The medical practitioner makes a diagnosis of the patient h while looking at the image displayed on the display unit 130.

The ultrasonic diagnosis apparatus having the structure described above uses the ultrasonic probe 10A in which side lobes in the lens direction are reduced, sound fields in the lens direction are uniformalized, and resolution in the lens direction is improved. Thus, since a clear internal image of the body of the patient h is obtained, it is possible to perform more precise diagnosis compared with the conventional ultrasonic diagnostic apparatus.

Note that, in this embodiment, the ultrasonic probe 10A according to the first embodiment is applied to the ultrasonic diagnostic apparatus. However, the invention is not limited to this. It is possible to also obtain a remarkable advantage when the ultrasonic probes 10B to 10E described in the respective embodiments are used.

When the ultrasonic probes 10A and 10B according to the first and the second embodiments are applied to the ultrasonic diagnostic apparatus, the piezoelectric elements 15B to 15F according to the third to the sixth embodiments may be used instead of the piezoelectric elements 15A and 15B of the ultrasonic probes 10A and 10B.

The invention is not limited only to the embodiments. In an implementation stage, it is possible to modify and embody the elements in a range not departing from the gist of the invention. In addition, it is possible to form various invention according to appropriate combinations of the plural elements disclosed in the embodiments. For example, several elements may be deleted from all the elements described in the embodiments. Moreover, the elements in the different embodiments may be combined appropriately.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An ultrasonic probe comprising:

ultrasonic piezoelectric elements that are arranged in a first direction at predetermined intervals and transmit and receive ultrasonic waves in a second direction substantially orthogonal to the first direction, wherein the respective ultrasonic piezoelectric elements have plural grooves, which are parallel to the first direction and do not pierce through an end face, on at least one end face of two end faces substantially orthogonal to the second direction of the respective ultrasonic piezoelectric elements, the ultrasonic waves are weighted in a third direction orthogonal to the first direction and the second direction according to shapes and arrangement of the respective plural grooves and transmitted and received, a conductive member is joined to the end face having the grooves of the respective ultrasonic piezoelectric elements along the third direction, and the plural grooves are formed substantially in the same depth and arranged at intervals gradually reducing in size toward both sides in the third direction.

2. An ultrasonic probe comprising:

ultrasonic piezoelectric elements that are arranged at predetermined interval in a first direction and transmit and receive ultrasonic waves in a second direction substantially orthogonal to the first direction; and electrodes joined to two end faces substantially orthogonal to the second direction of the respective ultrasonic piezoelectric elements, wherein the respective ultrasonic piezoelectric elements have plural grooves parallel to the first direction for weighting the ultrasonic waves in a third direction orthogonal to the first direction and the second direction and transmitting and receiving the ultrasonic waves on at least one end face of two end faces substantially orthogonal to the second direction, the electrodes joined to the end face having the plural grooves of the two end faces of the respective ultrasonic piezoelectric elements are divided into plural electrodes by the plural grooves, the divided plural electrodes are coupled by a conductive member, and the plural grooves are formed substantially in the same depth and arranged at intervals gradually reducing in size toward both sides in the third direction.

3. An ultrasonic probe comprising:

ultrasonic piezoelectric elements that are arranged in a first direction at predetermined intervals and transmit and receive ultrasonic waves in a second direction substantially orthogonal to the first direction, wherein the respective ultrasonic piezoelectric elements have plural grooves, which are parallel to the first direction and do not pierce through an end face, on at least one end face of two end faces substantially orthogonal to the second direction of the respective ultrasonic piezoelectric elements, the ultrasonic waves are weighted in a third direction orthogonal to the first direction and the second direction according to shapes and arrangement of the respective plural grooves and transmitted and received, a conductive member is joined to the end face having the grooves of the respective ultrasonic piezoelectric elements along the third direction, and the plural grooves are formed at substantially the same intervals in the third direction and depth of the grooves gradually increases toward both sides in the third direction.

4. An ultrasonic probe comprising:

ultrasonic piezoelectric elements that are arranged at predetermined interval in a first direction and transmit and receive ultrasonic waves in a second direction substantially orthogonal to the first direction; and electrodes joined to two end faces substantially orthogonal to the second direction of the respective ultrasonic piezoelectric elements, wherein the respective ultrasonic piezoelectric elements have plural grooves parallel to the first direction for weighting the ultrasonic waves in a third direction orthogonal to the first direction and the second direction and transmitting and receiving the ultrasonic waves on at least one end face of two end faces substantially orthogonal to the second direction, the electrodes joined to the end face having the plural grooves of the two end faces of the respective ultrasonic piezoelectric elements are divided into plural electrodes by the plural grooves, the divided plural electrodes are coupled by a conductive member, and the plural grooves are formed at substantially the same intervals in the third direction and depth of the grooves gradually increases toward both sides in the third direction.

5. An ultrasonic probe according to claim 1, wherein the conductive member is joined by a nonconductive adhesive filled in the plural grooves.

6. An ultrasonic probe comprising:

ultrasonic piezoelectric elements that are arranged at predetermined interval in a first direction and transmit and receive ultrasonic waves in a second direction substantially orthogonal to the first direction; and electrodes joined to two end faces substantially orthogonal to the second direction of the respective ultrasonic piezoelectric elements, wherein the respective ultrasonic piezoelectric elements have plural grooves parallel to the first direction for weighting the ultrasonic waves in a third direction orthogonal to the first direction and the second direction and transmitting and receiving the ultrasonic waves on at least one end face of two end faces substantially orthogonal to the second direction, the electrodes joined to the end face having the plural grooves of the two end faces of the respective ultrasonic piezoelectric elements are divided into plural electrodes by the plural grooves, the divided plural electrodes are coupled by a conductive member, and the conductive member is joined by a nonconductive adhesive filled in the plural grooves.

7. An ultrasonic probe comprising:

plural ultrasonic piezoelectric elements that are arranged at predetermined intervals in a first direction and transmit and receive ultrasonic waves in a second direction substantially orthogonal to the first direction; and an acoustic matching layer having electrical conductivity that is provided on one end face of two end faces substantially orthogonal to the second direction of the ultrasonic piezoelectric elements, wherein the ultrasonic piezoelectric elements and the acoustic matching layer have plural grooves that are substantially parallel to the first direction and extend from the other end face of the ultrasonic piezoelectric elements to the middle of the acoustic matching layer, and the ultrasonic waves are weighted in a third direction orthogonal to the first direction and the second direction and transmitted and received.

8. An ultrasonic probe comprising:

plural ultrasonic piezoelectric elements that are arranged at predetermined intervals in a first direction and transmit and receive ultrasonic waves in a second direction substantially orthogonal to the first direction; and an acoustic matching layer having electrical conductivity that is provided on one end face of two end faces substantially orthogonal to the second direction of the ultrasonic piezoelectric elements, wherein the ultrasonic piezoelectric elements and the acoustic matching layer have plural grooves that are substantially parallel to the first direction and extend from an end face of the acoustic matching layer on the opposite side of the ultrasonic piezoelectric elements to the middle of the ultrasonic piezoelectric elements, and the ultrasonic waves, are weighted in a third direction orthogonal to the first direction and the second direction and transmitted and received.

9. An ultrasonic probe according to claim 7, wherein a drive voltage is applied to the ultrasonic piezoelectric elements via the acoustic matching layer.

10. An ultrasonic probe according to claim 8, wherein a drive voltage is applied to the ultrasonic piezoelectric elements via the acoustic matching layer.

11. An ultrasonic diagnostic apparatus comprising:

an ultrasonic probe that transmits ultrasonic waves to and receives ultrasonic waves from a patient; and an image creating device that creates an ultrasonic image of the patient on the basis of the ultrasonic waves received by the ultrasonic probe, wherein the ultrasonic probe includes:

plural ultrasonic piezoelectric elements that are arranged at predetermined intervals in a first direction and transmit and receive ultrasonic waves in a second direction substantially orthogonal to the first direction; and an acoustic matching layer having electrical conductivity that is provided on one end face of two end faces substantially orthogonal to the second direction of the ultrasonic piezoelectric elements, wherein the ultrasonic piezoelectric elements and the acoustic matching layer have plural grooves that are substantially parallel to the first direction and extend from the other end face of the ultrasonic piezoelectric elements to the middle of the acoustic matching layer, and the ultrasonic waves are weighted in a third direction orthogonal to the first direction and the second direction and transmitted and received.

12. An ultrasonic diagnostic apparatus comprising:

an ultrasonic probe that transmits ultrasonic waves to and receives ultrasonic waves from a patient; and an image creating device that creates an ultrasonic image of the patient on the basis of the ultrasonic waves received by the ultrasonic probe, wherein the ultrasonic probe includes:

plural ultrasonic piezoelectric elements that are arranged at predetermined intervals in a first direction and transmit and receive ultrasonic waves in a second direction substantially orthogonal to the first direction; and an acoustic matching layer having electrical conductivity that is provided on one end face of two end faces substantially orthogonal to the second direction of the ultrasonic piezoelectric elements, wherein the ultrasonic piezoelectric elements and the acoustic matching layer have plural grooves that are substantially parallel to the first direction and extend from an end face of the acoustic matching layer on the opposite side of the ultrasonic piezoelectric elements to the middle of the ultrasonic piezoelectric elements, and the ultrasonic waves, are weighted in a third direction orthogonal to the first direction and the second direction and transmitted and received.

13. An ultrasonic diagnostic apparatus comprising:

an ultrasonic probe that transmits ultrasonic waves to and receives ultrasonic waves from a patient; and an image creating device that creates an ultrasonic image of the patient on the basis of the ultrasonic waves received by the ultrasonic probe, wherein the ultrasonic probe includes ultrasonic piezoelectric elements that are arranged in a first direction at predetermined intervals and transmit and receive ultrasonic waves in a second direction substantially orthogonal to the first direction, the respective ultrasonic piezoelectric elements have plural grooves, which are parallel to the first direction and do not pierce through an end face, on at least one end face of two end faces substantially orthogonal to the second direction of the respective ultrasonic piezoelectric elements, the ultrasonic waves are weighted in a third direction orthogonal to the first direction and the second direction according to shapes and arrangement of the respective plural grooves and transmitted and received, a conductive member is joined to the end face having the grooves of the respective ultrasonic piezoelectric elements along the third direction, and the plural grooves are formed substantially in the same depth and arranged at intervals gradually reducing in size toward both sides in the third direction.

14. An ultrasonic diagnostic apparatus comprising:

an ultrasonic probe that transmits ultrasonic waves to and receives ultrasonic waves from a patient; and an image creating device that creates an ultrasonic image of the patient on the basis of the ultrasonic waves received by the ultrasonic probe, wherein the ultrasonic probe further includes ultrasonic piezoelectric elements that are arranged at predetermined interval in a first direction and transmit and receive ultrasonic waves in a second direction substantially orthogonal to the first direction, and electrodes joined to two end faces substantially orthogonal to the second direction of the respective ultrasonic piezoelectric elements, the respective ultrasonic piezoelectric elements have plural grooves parallel to the first direction for weighting the ultrasonic waves in a third direction orthogonal to the first direction and the second direction and transmitting and receiving the ultrasonic waves on at least one end face of two end faces substantially orthogonal to the second direction, the electrodes joined to the end face having the plural grooves of the two end faces of the respective ultrasonic piezoelectric elements are divided into plural electrodes by the plural grooves, the divided plural electrodes are coupled by a conductive member, and the plural grooves are formed substantially in the same depth and arranged at intervals gradually reducing in size toward both sides in the third direction.

15. An ultrasonic diagnostic apparatus comprising:

an ultrasonic probe that transmits ultrasonic waves to and receives ultrasonic waves from a patient; and an image creating device that creates an ultrasonic image of the patient on the basis of the ultrasonic waves received by the ultrasonic probe, wherein the ultrasonic probe includes ultrasonic piezoelectric elements that are arranged in a first direction at predetermined intervals and transmit and receive ultrasonic waves in a second direction substantially orthogonal to the first direction, the respective ultrasonic piezoelectric elements have plural grooves, which are parallel to the first direction and do not pierce through an end face, on at least one end face of two end faces substantially orthogonal to the second direction of the respective ultrasonic piezoelectric elements, the ultrasonic waves are weighted in a third direction orthogonal to the first direction and the second direction according to shapes and arrangement of the respective plural grooves and transmitted and received, a conductive member is joined to the end face having the grooves of the respective ultrasonic piezoelectric elements along the third direction, and the plural grooves are formed at substantially the same intervals in the third direction and depth of the grooves gradually increases toward both sides in the third direction.

16. An ultrasonic diagnostic apparatus comprising:

an ultrasonic probe that transmits ultrasonic waves to and receives ultrasonic waves from a patient; and an image creating device that creates an ultrasonic image of the patient on the basis of the ultrasonic waves received by the ultrasonic probe, wherein the ultrasonic probe further includes ultrasonic piezoelectric elements that are arranged at predetermined interval in a first direction and transmit and receive ultrasonic waves in a second direction substantially orthogonal to the first direction, and electrodes joined to two end faces substantially orthogonal to the second direction of the respective ultrasonic piezoelectric elements, the respective ultrasonic piezoelectric elements have plural grooves parallel to the first direction for weighting the ultrasonic waves in a third direction orthogonal to the first direction and the second direction and transmitting and receiving the ultrasonic waves on at least one end face of two end faces substantially orthogonal to the second direction, the electrodes joined to the end face having the plural grooves of the two end faces of the respective ultrasonic piezoelectric elements are divided into plural electrodes by the plural grooves, the divided plural electrodes are coupled by a conductive member, and the plural grooves are formed at substantially the same intervals in the third direction and depth of the grooves gradually increases toward both sides in the third direction.

17. An ultrasonic diagnostic apparatus according to claim 13, wherein the conductive member is joined by a nonconductive adhesive filled in the plural grooves.

18. An ultrasonic diagnostic apparatus comprising:

an ultrasonic probe that transmits ultrasonic waves to and receives ultrasonic waves from a patient; and an image creating device that creates an ultrasonic image of the patient on the basis of the ultrasonic waves received by the ultrasonic probe, wherein the ultrasonic probe further includes ultrasonic piezoelectric elements that are arranged at predetermined interval in a first direction and transmit and receive ultrasonic waves in a second direction substantially orthogonal to the first direction; and electrodes joined to two end faces substantially orthogonal to the second direction of the respective ultrasonic piezoelectric elements, the respective ultrasonic piezoelectric elements have plural grooves parallel to the first direction for weighting the ultrasonic waves in a third direction orthogonal to the first direction and the second direction and transmitting and receiving the ultrasonic waves on at least one end face of two end faces substantially orthogonal to the second direction, the electrodes joined to the end face having the plural grooves of the two end faces of the respective ultrasonic piezoelectric elements are divided into plural electrodes by the plural grooves, the divided plural electrodes are coupled by a conductive member, and the conductive member is joined by a nonconductive adhesive filled in the plural grooves.

* * * * *